(12) United States Patent
Suzuki et al.

(10) Patent No.: US 9,293,383 B2
(45) Date of Patent: Mar. 22, 2016

(54) METHOD OF MANUFACTURING SEMICONDUCTOR DEVICE

(71) Applicant: Renesas Electronics Corporation, Kawasaki-shi, Kanagawa (JP)

(72) Inventors: Masakatsu Suzuki, Gunma (JP); Koji Saito, Gunma (JP); Mamoru Otake, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/738,858

(22) Filed: Jun. 13, 2015

(65) Prior Publication Data
US 2016/0005665 A1    Jan. 7, 2016

(30) Foreign Application Priority Data

Jul. 7, 2014    (JP) .................................. 2014-139269

(51) Int. Cl.
| H01L 21/00 | (2006.01) |
| H01L 21/66 | (2006.01) |
| H01L 25/00 | (2006.01) |
| H01L 21/56 | (2006.01) |
| H01L 21/67 | (2006.01) |

(52) U.S. Cl.
CPC .............. *H01L 22/20* (2013.01); *H01L 21/565* (2013.01); *H01L 22/10* (2013.01); *H01L 25/50* (2013.01); *H01L 21/67282* (2013.01); *H01L 21/67294* (2013.01); *H01L 2225/0651* (2013.01)

(58) Field of Classification Search
None
See application file for complete search history.

(56) References Cited

U.S. PATENT DOCUMENTS

| 8,649,896 B2 | 2/2014 | Yokosawa | |
| 2011/0071662 A1* | 3/2011 | Yokosawa | H01L 21/67294 700/114 |
| 2012/0290117 A1* | 11/2012 | Wang | H01L 23/544 700/108 |
| 2014/0147971 A1* | 5/2014 | Yokosawa | H01L 21/67294 438/107 |

FOREIGN PATENT DOCUMENTS

| JP | 2002-299509 A | 10/2002 |
| JP | 2011-066340 A | 3/2011 |

* cited by examiner

*Primary Examiner* — Angel Roman
(74) *Attorney, Agent, or Firm* — Shapiro, Gabor and Rosenberger, PLLC

(57) ABSTRACT

Reading reliability of a code formed in a semiconductor device is improved.
A manufacturing method of semiconductor devices according to one embodiment includes a step of forming a sealing body MR in a plurality of device regions DVP with a code (first identification information) MK3 being formed outside the device regions DVP of a wiring substrate. Also, the manufacturing method of semiconductor devices according to one embodiment includes a step of, after forming the sealing body MR, reading the code MK3 and affixing another code (second identification information) to the sealing body MR. Further, before the step of forming the sealing body MR, a dam part DM is formed between a marking region MKR in which the code MK3 is formed and the device regions DVP.

13 Claims, 25 Drawing Sheets

METHOD OF MANUFACTURING SEMICONDUCTOR DEVICE

CROSS-REFERENCE TO RELATED APPLICATIONS

The disclosure of Japanese Patent Application No. 2014-139269 filed on Jul. 7, 2014 including the specification, drawings and abstract is incorporated herein by reference in its entirety.

BACKGROUND

The present invention relates to a technology for manufacturing a semiconductor device and, for instance, it relates to a technology which is effectively applicable to a semiconductor device to which a code for identifying product information is affixed.

Japanese Unexamined Patent Publication No. 2011-66340 (Patent Document 1) describes a technology of engraving a two-dimensional bar code corresponding to an identification number of a semiconductor device in a sealing body of the semiconductor device.

Further, Japanese Unexamined Patent Publication No. 2002-299509 (Patent Document 2) describes a technology of forming a dam in such a way that it surrounds a circumference of a solder-resist film which covers a circuit pattern of a substrate for a semiconductor device.

[Patent Document 1]
Japanese Unexamined Patent Publication No. 2011-66340
[Patent Document 2]
Japanese Unexamined Patent Publication No. 2002-299509

SUMMARY OF THE INVENTION

The present inventors are studying a technology for improving performance of a semiconductor device. As part of the study, in order to facilitate the analysis of defects occurring in a manufacturing step of the semiconductor device, the present inventors conducted a study of a technology for affixing identification information to the semiconductor device.

When analyzing the defect occurring in the manufacturing step of the semiconductor device, in order to be able to trace historical data of each step, for instance, it is preferable to affix identification information to a vacant region of a base material to be provided for assembling the semiconductor device and to conduct each step.

On the other hand, in recent years, in order to reduce manufacturing cost of a semiconductor device, there had been a tendency of increasing the number of device regions provided in one base material. As a result, of the base material, vacant regions not being device regions were reduced as compared with the case before the number of the device regions was increased. Consequently, as compared with the case before the number of the device regions was increased, a distance (spacing) between the identification information formed in the vacant region and the device region became shorter. As a result, it was found out that, in a step of sealing the device region with a resin, when the resin supplied to the device region leaked through an interface between a molding apparatus and the base material, the identification information affixed to the vacant region of the base material was likely to be covered with the leaked resin.

Other problems and novel features will be apparent from the description herein and accompanying drawings.

A manufacturing method of semiconductor devices according to one embodiment includes a step of forming a sealing body in a plurality of device regions with first identification information being formed outside the device regions of a wiring substrate. Also, the manufacturing method of semiconductor devices according to one embodiment includes a step of, after forming the sealing body, reading the first identification information and affixing second identification information to the sealing body. Further, before the step of forming the sealing body, a dam part is formed between a marking region in which the first identification information is formed and the device regions.

According to one embodiment described above, reading reliability of a code formed in the semiconductor device can be improved.

DETAILED DESCRIPTION

Figure 1:
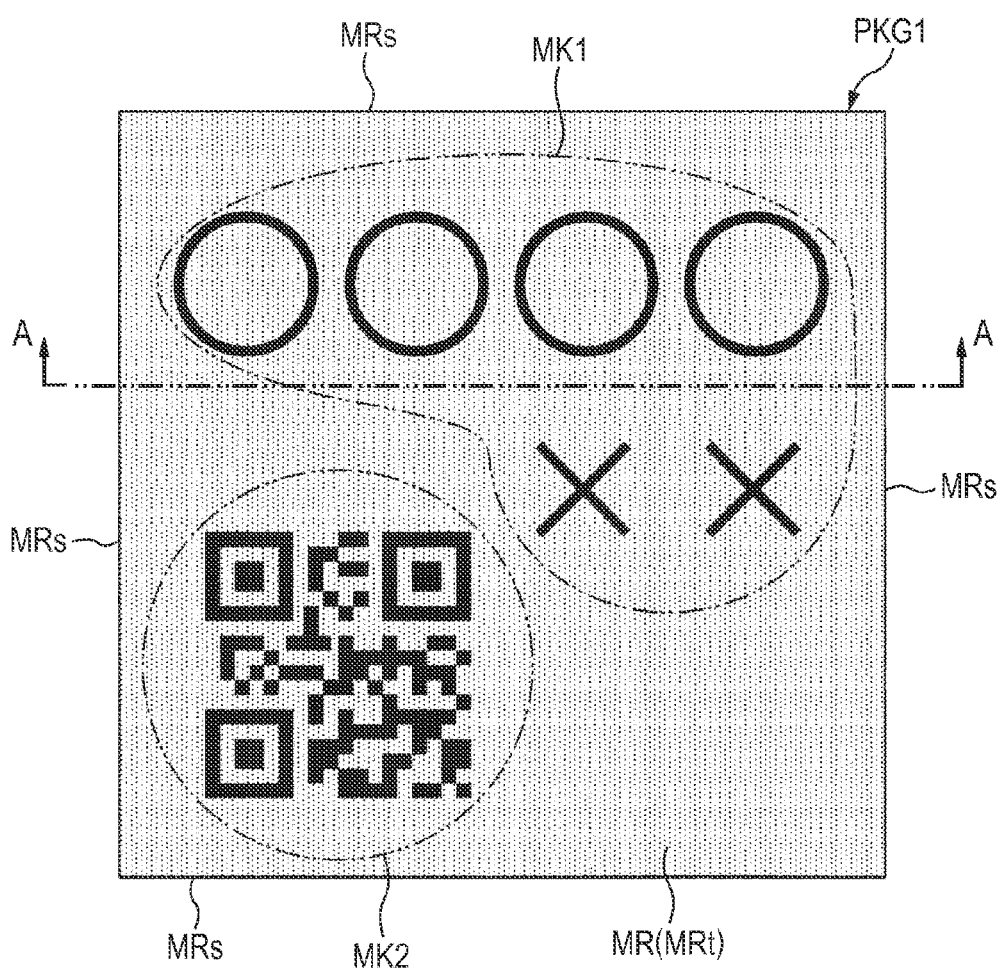
FIG. 1 is a plan view of a semiconductor device according to an embodiment.

[Explanation of Description Form, Basic Terminology, and Use Thereof in Present Application]

In the present application, if necessary for the sake of convenience, the description of an embodiment may be such that the embodiment is divided into a plurality of parts or sections in the description thereof. However, they are by no means independent of or distinct from each other unless particularly explicitly described otherwise, and one of the individual parts of a single example is details, variations, and so forth of part or whole of the others. In principle, a repeated description of like parts will be omitted. Each constituent element in the embodiment is not indispensable unless particularly explicitly described otherwise, unless the constituent element is theoretically limited to a given number, or unless it is obvious from the context that the constituent element is indispensable.

Likewise, even when such wording as "X comprised of A" is used in association with a material, a composition, or the like in the description of the embodiment or the like, it does not exclude a material, a composition, or the like which contains an element other than A as one of the main constituent elements thereof unless particularly explicitly described otherwise or unless it is obvious from the context that it excludes such a material, a composition, or the like. For example, when a component is mentioned, the wording means "X containing A as a main component" or the like. It will be appreciated that, even when, e.g., a "silicon member" or the like is mentioned, it is not limited to pure silicon, and a member containing a SiGe (silicon, germanium) alloy, another multi-element alloy containing silicon as a main component, another additive, or the like is also included. Further, it is naturally understood that the term gold plating, a Cu layer, nickel plating, or the like, herein used is assumed to embrace not only the pure one but also a member containing gold, Cu, nickel, or the like as a main component, unless otherwise specified.

Further, when a specific numerical value or numerical amount is mentioned, it may be a value more or less than a specific numerical value unless particularly explicitly described otherwise, unless the numerical value is theoretically limited to a given number, or unless it is obvious from the context that the numerical value is limited to a given number.

Further, in the present application, the term "planar surface" or "side surface" is used. With the semiconductor element-formed surface of the semiconductor chip as the reference surface, the surface in parallel with the reference surface is described as a planar surface. Also, the surface crossing with the planar surface is described as a side surface. Further, the direction in which two spaced planar surfaces are coupled in side view is described as a thickness direction.

Further, in the present application, the term "top surface" or "bottom surface" may be used. However, the mounting forms of a semiconductor package include various forms. Accordingly, after mounting a semiconductor package, for instance, the top surface may be arranged below the bottom surface. In the present application, the planar surface on the element-formed surface side of the semiconductor chip or the planar surface on the chip mounting surface side of the wiring substrate is described as a top surface, and the surface arranged on the opposite side to the top surface is described as a bottom surface.

In each of the drawings of embodiments, the same or like parts are designated by the same or similar marks or reference numerals, and a description thereof will not be repeated in principle.

In the present application, when such wording as "read" a "code" etc. is used, it is intended to mean that, after obtaining image information of the "code", being based on the image information obtained, a "decryption (decoding)" process is performed and information before encryption is obtained.

In then accompanying drawings, hatching or the like may be omitted even in a cross section when hatching or the like results in complicated illustration or when the distinction between portion to be hatched and a vacant space is distinct. In relation thereto, even a two-dimensionally closed hole may have a background outline thereof omitted when it is obvious from the description or the like that the hole is two-dimensionally closed, and so forth. On the other hand, even though not shown in a cross section, a portion other than a vacant space may be hatched to clearly show that the hatched portion is not a vacant space.

Embodiment

A technology to be explained in an embodiment below is widely applicable to the semiconductor device in which a code is affixed to a sealing body for sealing a semiconductor chip mounted over a base material. In the present embodiment, by way of example, an explanation will be made as to a mode in which the above technique is applied to a BGA (Ball Grid Array) type semiconductor device where ball-like external terminals are arranged in a matrix shape on the side of a packaging surface of a wiring substrate.

<Semiconductor Device>

Figure 2:
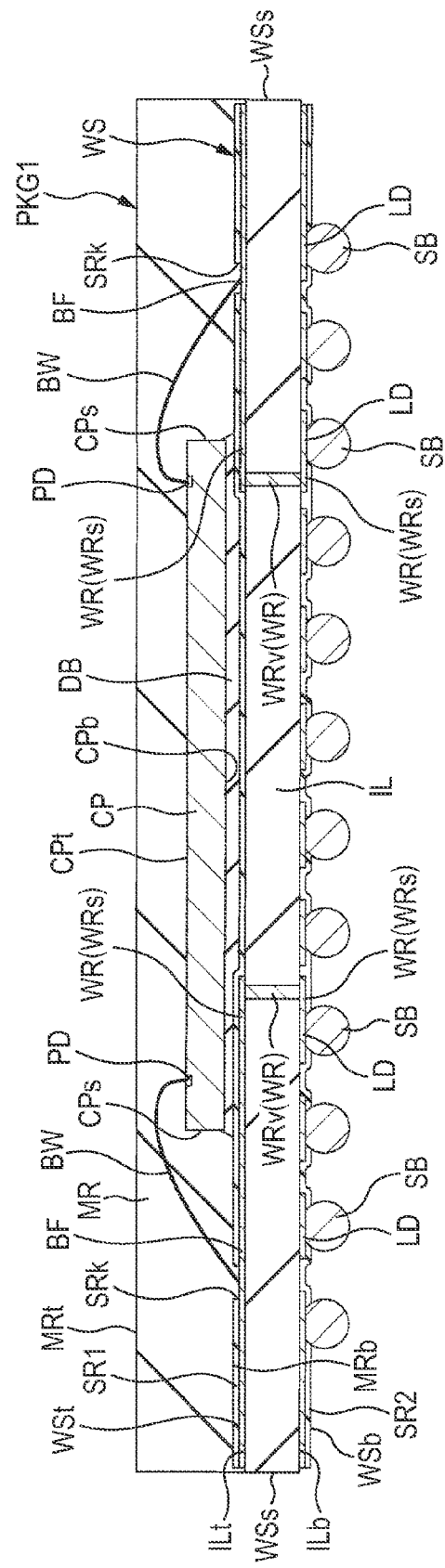
FIG. 2 is a cross-sectional view taken along line A-A of FIG. 1.

First, referring to FIGS. 1 to 3, an outline of the configuration of a semiconductor device PKG1 of the present embodiment will be explained. FIG. 1 is a plan view of the semiconductor device according to the present embodiment. Further, FIG. 2 is a cross-sectional view taken along line A-A of FIG. 1. Still further, FIG. 3 is a perspective plan view showing an internal configuration of the semiconductor device with a sealing body shown in FIG. 1 removed.

Figure 3:
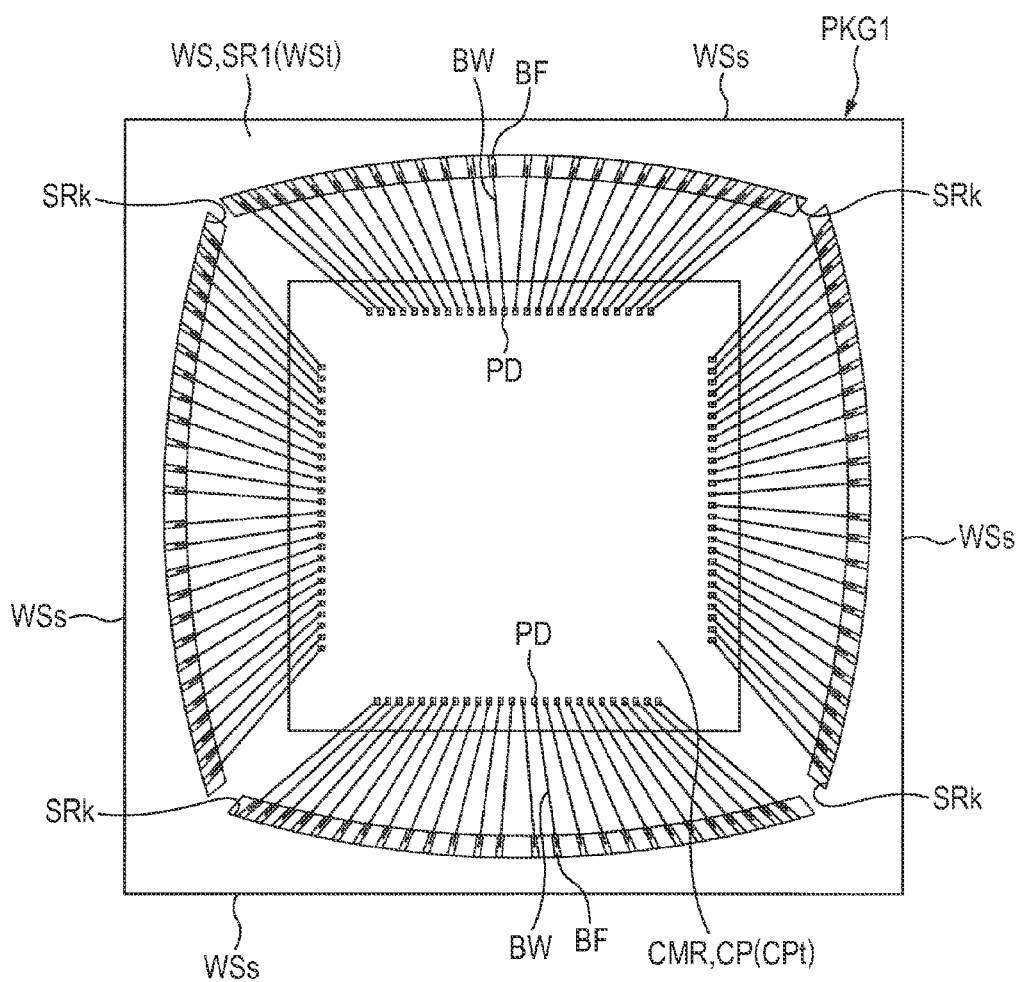
FIG. 3 is a perspective plan view showing an internal configuration of the semiconductor device in a state where a sealing body shown in FIG. 1 is removed.

As shown in FIGS. 2 and 3, the semiconductor device PKG1 according to the present embodiment includes a wiring substrate WS, a semiconductor chip CP mounted over the wiring substrate WS, and a sealing body MR (see FIGS. 1 and 2) for sealing the semiconductor chip CP. The semiconductor chip CP and a plurality of terminals BF formed over the wiring substrate WS are electrically coupled, respectively, via a plurality of wires BW containing conductive members such as gold (Au) and copper (Cu). Moreover, as shown in FIG. 2, over a lower surface WSb being a packaging surface of the wiring substrate WS, a plurality of lands LD electrically coupled with the semiconductor chip CP are formed. Further, a plurality of solder balls (solder materials) SB are coupled to the lands LD, respectively. The lands LD and the solder balls SB are external electrodes (external connection terminals) for electrically coupling the semiconductor device PKG1 with a packaging substrate (mother board). The lands LD and the solder balls SB are arranged in an array (in a matrix shape) over the lower surface WSb.

As shown in FIG. 2, the wiring substrate WS includes: an upper surface (chip mounting surface, main surface) WSt; a lower surface (packaging surface, main surface) WSb located on the opposite side of the upper surface WSt; and a side surface WSs located between the upper surface WSt and the lower surface WSb. The wiring substrate WS is an interposer where there are formed a plurality of wirings WR which electrically couple the terminals BF and the lands LD to an insulating layer IL being a base material, as well as the terminals BF with the lands LD. The insulating layer IL contains a prepreg in which, for instance, a resin is impregnated into glass fiber or carbon fiber.

Moreover, an upper surface ILt and a lower surface ILb of the insulating layer IL are covered with insulating films (solder-resist films, protective films) SR1 and SR2, respectively. The insulating films SR1 and SR2 are so formed as to cover the wirings WR formed over the upper and lower surfaces ILt and ILb of the insulating layer IL. The insulating films SR1 and SR2 are protective films for preventing short-circuit and disconnection etc. among the wirings WR. The insulating film (upper surface side insulating film) SR1 is formed over the upper surface WSt which is a top surface of the wiring substrate WS and the insulating film (lower surface side insulating film) SR2 is formed over the lower surface WSb which is a bottom surface of the wiring substrate WS, respectively.

Moreover, as shown in FIG. 3, the wiring substrate WS is quadrangular in a plan view. There is provided, in the upper surface WSt of the wiring substrate WS, a chip mounting region CMR where a semiconductor chip CP is mounted. In addition, the chip mounting region CMR is a region in which semiconductor chip CP is to be mounted. Therefore, there is no need for an actual boundary line to exist to be observed visually.

According to the present embodiment, the chip mounting region CMR is in the shape of a quadrangle, in a plan view, along an external form of the wiring substrate WS and, for instance, it is arranged substantially in the center (central part) of the upper surface WSt. Around the chip mounting region CMR, over the upper surface WSt, a plurality of terminals (bonding leads, bonding pads) BF are formed. The terminals BF are bonding pads for electrically coupling the wire(s) BW and the wiring substrate WS, and contain, for instance, metals such as copper (Cu). Moreover, the terminals BF are arranged along each side of the chip mounting region CMR. Also, in the present embodiment, along each side of the chip mounting region CMR (namely, each side of the semiconductor chip CP), a row of the terminals BF is arranged. As shown in FIG. 2, each terminal BF is exposed from the insulating film SR1 through an opening SRk formed in the insulating film SR1 covering the upper surface ILt of the insulating layer IL.

Moreover, each terminal BF is electrically coupled, through the wiring WR of the wiring substrate WS, with a land (terminal, electrode) LD formed over the lower surface WSb of the insulating layer IL. Specifically, the wiring substrate WS has a plurality of wiring layers. In FIG. 2, there are shown two wiring layers, which include a wiring layer formed over the upper surface WSt and a wiring layer formed over the lower surface WSb. In each wiring layer, there are formed, for instance, a plurality of copper (Cu) wirings WRs. The wirings WRs in each wiring layer are electrically coupled through an interlayer wiring (through-hole wiring, via wiring) WRv formed from the side of one surface (upper surface Wst, in the present embodiment) of either the upper surface WSt or the lower surfaces WSb toward the side of the other surface (lower surface SWb, in the present embodiment).

Moreover, the lands LD formed over the lower surface ILb of the insulating layer IL are formed integrally with the wirings WRs also formed over the lower surface ILb. As shown in FIG. 2, each land LD is exposed from the insulating film SR2 in an opening formed in the insulating film SR2 covering the lower surface ILb of the insulating layer IL. In the example shown in FIG. 2, at a position overlapping the land LD of the insulating film SR2, the opening smaller than the land LD is formed and part of the land LD is exposed. Further, the solder balls SB which are external electrodes are joined to the lands LD.

In addition, FIG. 2 shows a wiring substrate having two wiring layers in which the wirings WRs are formed over the upper surface ILt and the lower surface ILb of the insulating layer IL, respectively. However, the number of the wiring layers of the wiring substrate WS is not limited to two and, for instance, it can be a so-called multilayer wiring substrate where a plurality of wiring layers are formed in the insulating layer IL. In this case, by forming an additional wiring layer between a top-layer wiring layer and a bottom-layer wiring layer, it becomes possible to increase space for laying out the wirings, being effective to be applied to the semiconductor device having numbers of terminals.

Next, the semiconductor chip CP to be mounted onto the wiring substrate WS will be described. As shown in FIG. 2, the semiconductor chip CP according to the present embodiment includes: a surface (main surface) CPt; a back surface (main surface) CPb located on the opposite side of the surface CPt; and a side surface CPs located between the surface CPt and the back surface CPb. Moreover, as shown in FIG. 3, the planar shape (shape of the surface CPt and the back surface CPb) of the semiconductor chip CP is quadrangular. A plurality of pads (electrodes, chip electrodes) PD are formed over the surface CPt of semiconductor chip CP. The pads PD are arranged along respective sides of the semiconductor chip CP on the side of the outer edge portion over the surface CPt.

Moreover, over the surface CPt of the semiconductor chip CP, a plurality of semiconductor elements (circuit elements) such as a diode and a transistor are formed, respectively, and are electrically coupled with the pads PD, respectively, through wiring (wiring layer) (not shown) formed over the semiconductor element. Thus, the semiconductor chip CP includes the semiconductor elements formed over the surface CPt and the wiring for electrically coupling the semiconductor elements to configure an integrated circuit.

Further, a base material (semiconductor substrate) having the surface CPt which is a semiconductor element forming surface of the semiconductor chip CP contains, for instance, silicon (Si). Also, over a top surface of the surface CPt, there is formed a passivation film (not shown) which is an insulating film. Each surface of the pads PD is exposed from the insulating film in an opening formed in the passivation film.

Moreover, the pad PD contains a metal and, according to the present embodiment, for instance, it contains aluminum (Al). Furthermore, over the surface of the pad PD, there may be formed a metal film such as a gold (Au) film, for instance, through a nickel (Ni) film, or a laminated film thereof.

Moreover, according to the present embodiment, the semiconductor chip CP is mounted onto the wiring substrate WS by a so-called face-up packaging method in which the back surface CPb and the upper surface WSt of the wiring substrate are opposed to each other. The semiconductor chip CP is fixed to the upper surface WSt of the chip mounting region CMR (see FIG. 3) through an adhesive DB. The adhesive DB is not limited to a particular type so long as it can fix the semiconductor chip CP to the upper surface WSt of the wiring substrate WS firmly. According to the present embodiment, for instance, an epoxy thermosetting resin is used.

Moreover, as shown in FIGS. 2 and 3, the semiconductor chip CP is electrically coupled with the wiring substrate WS via a plurality of wires BW, respectively. More specifically, one end of the wire BW is coupled to the pad PD over the surface CPt of the semiconductor chip CP and the other end is coupled to the terminal BF of the wiring substrate WS. The wire BW contains, for instance, gold (Au), and is formed by a so-called normal bonding method in which a joint with the pad PD is on a first bonding side and a joint with the terminal BF is on a second bond side. However, the coupling method of the wire BW shown in FIG. 2 is one example and, as a modification, the wire BW may be formed by a so-called reverse bonding method in which the joint with the pad PD is on the second bonding side and the joint with the terminal BF is on the first bonding side.

Next, a description will be made as to a sealing body MR for sealing the semiconductor chip CP, the wires BW, and the terminals BF. As shown in FIG. 1, the sealing body MR is quadrangular in a plan view. Moreover, the sealing body MR includes: an upper surface MRt; a lower surface MRb (see FIG. 2) located on the opposite side of the upper surface MRt; and four side surfaces MRs located between the upper surface MRt and the lower surface MRb. In the example shown in FIG. 2, the sealing body MR is formed over the wiring substrate WS. Therefore, the lower surface MRb of the sealing body MR is opposed to the upper surface WSt of the wiring substrate WS. The upper surface MRt of the sealing body MR is located on the opposite side of the packaging surface. Therefore, for instance, when a structure is not arranged over the semiconductor device PKG1 after packaging, the upper surface MRt becomes a visually recognizable surface.

Moreover, the sealing body MR is an insulating resin body mainly included numbers of filler grains such as thermosetting resin like an epoxy resin, a hardening agent, and silica. Moreover, carbon particles are mixed in the sealing body MR as a colorant.

Further, as shown in FIG. 2, the sealing body MR is cured in a state of being in close contact with the semiconductor chip CP and the wires BW arranged inside a package. That is, the sealing body MR has a function of protecting the semiconductor chip CP and the wires BW.

Moreover, as shown in FIG. 1, a plurality of symbols are affixed onto the upper surface MRt of the sealing body MR. In an example shown in FIG. 1, the symbols include a mark MK1 being a character symbol in which information such as a product model name is expressed using characters. Moreover, the symbols include, for instance, codes (identification information, encrypted identification information) MK2 being graphic symbols in which information is encrypted. Moreover, in the example shown in FIG. 1, the mark MK1 and the code MK2 are engraved marks made recognizable by radiating a laser beam to the sealing body MR and forming concave and convex portions in the upper surface MRt thereof.

As shown in FIG. 1, of the symbols affixed onto the sealing body MR, the mark MK1 is a character symbol in which, for instance, information such as a product model name is expressed using characters. Thus, by exhibiting information such as the product model name as a character symbol over the sealing body MR, the semiconductor device PKG1 can be recognized visually.

Moreover, of the symbols affixed onto the sealing body MR, the code MK2 is, for instance, a graphic symbol in which information is encrypted. In order to decode the information recorded on the code MK2, the symbol information is recognized using a reader to be described later and the information is decoded, for instance, as electronic data. As in the code MK2, when information is turned into a graphic form, if it can be read by the reader, whether it is visually recognizable or not doesn't matter. Therefore, as compared with symbols such as the mark MK1 which is required to be recognized visually, figures can be drawn smaller. In other words, in the case of the code MK2, as compared with the mark MK1, the amount of information per unit area can be increased. Moreover, as in the code MK2, when information is turned into a graphic form, for instance, the information can be easily converted to electronic data through the reader.

For instance, if the code MK2 is made by encrypting information about historical data of production for an individual product such as date of production of the semiconductor device PKG1, a production line, a lot number, and a lot number of a constituent member, even when a defect etc. in the process occur, it is possible to quickly specify a cause of the defect. Moreover, for instance, if information such as the product model name is turned into a graphic form as the code MK2, by converting it to electronic data, it becomes easy to perform stock control.

As the graphic symbol including information capable of being read using the reader, there is, for instance, one which is a so-called bar code where in a symbol region having a belt-like form, black and white lines with various widths are arranged by turns along an extending direction of the belt. The bar code is a so-called one-dimensional code that has information in the extending direction of the belt but does not have information in a direction orthogonal to the extending direction.

On the other hand, in the example shown in FIG. 1, the code MK2 is a so-called two-dimensional code that has information in two directions (X-direction and Y-direction in FIG. 1). As the two-dimensional code has information in two directions, it is characteristic in that the amount of information that can be recorded is much larger as compared with a one-dimensional code.

Moreover, in the case of the two-dimensional code, since the amount of information can be increased, various pieces of information other than information concerning the semiconductor device PKG1 can also be included. For instance, the code MK2 includes a cut-away symbol (also called a "finder pattern") which is an alignment mark for detecting a position or orientation of the code MK2. By allowing the code MK2 to include alignment marks such as the cut-away symbol, it becomes possible to reduce time for the reader to read information contained in the code MK2.

Moreover, for instance, the code MK2 can includes an error-correcting code (for instance, an error-correcting code called a "Reed-Solomon code"). In this case, for instance, even when part of the symbol information of the code MK2 cannot be obtained due to a deficit etc., information can be obtained through correction by the code for error correction. That is, in the case of a two-dimensional code, the amount of information can be increased as compared with the one-dimensional code. Therefore, reliability of reading the information recorded on the code can be improved. However, even if the error-correcting code is included, information may not be decoded, for instance, when most of the symbol information of the code MK2 cannot be obtained.

<Manufacturing Method of Semiconductor Device>

Figure 4:
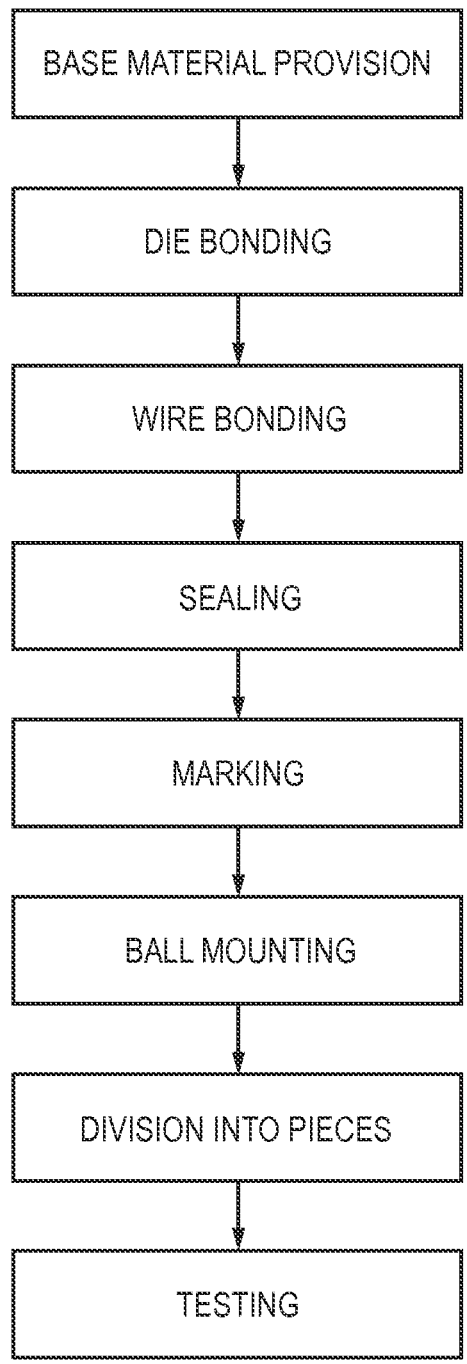
FIG. 4 is an explanatory view showing an assembly flow of the semiconductor device explained with reference to FIGS. 1 to 3.

Next, a method of manufacturing the semiconductor device PKG1 described with reference to FIGS. 1 to 3 will be explained by using a flow chart shown in FIG. 4. FIG. 4 is an explanatory view showing an assembly flow of the semiconductor device explained with reference to FIGS. 1 to 3.

<Base Material Providing Step>

Figure 5:
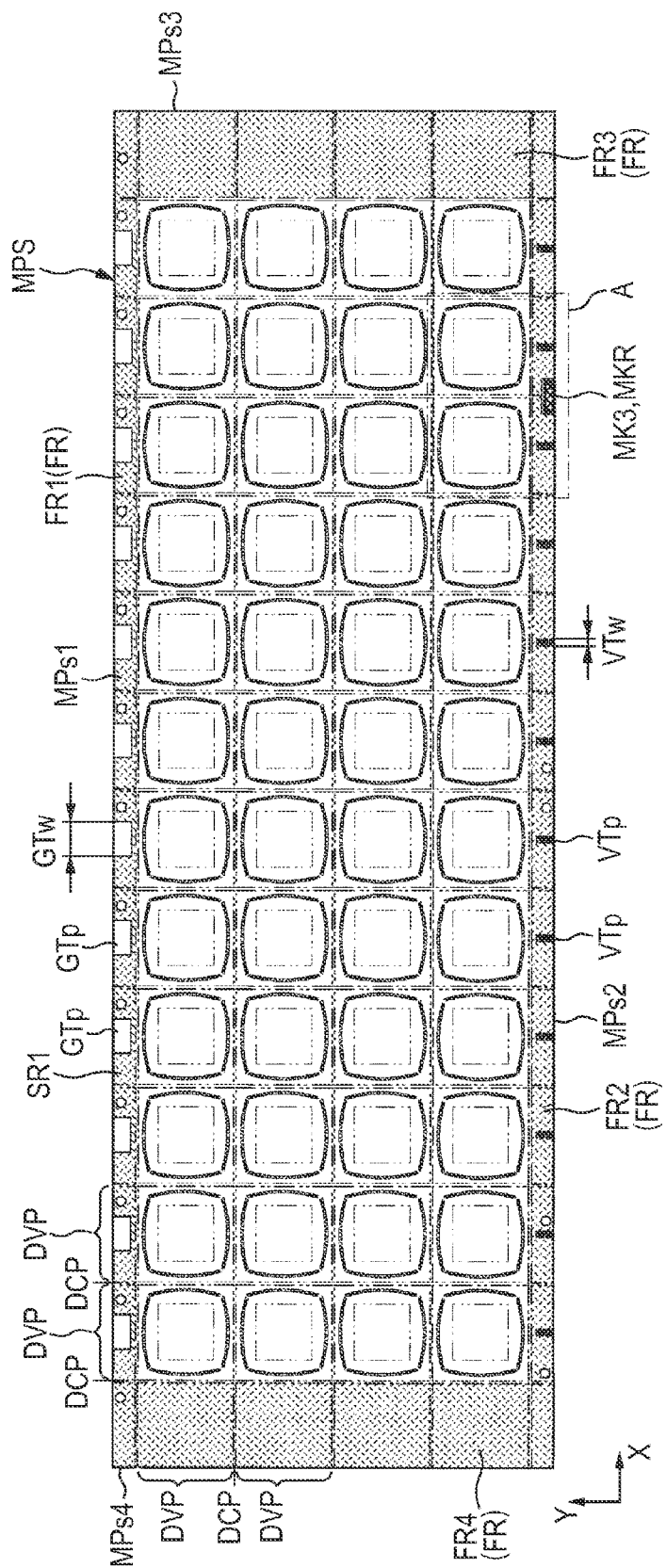
FIG. 5 is a plan view showing an entire configuration of a wiring substrate provided in a base material providing step shown in FIG. 4.
Figure 6:
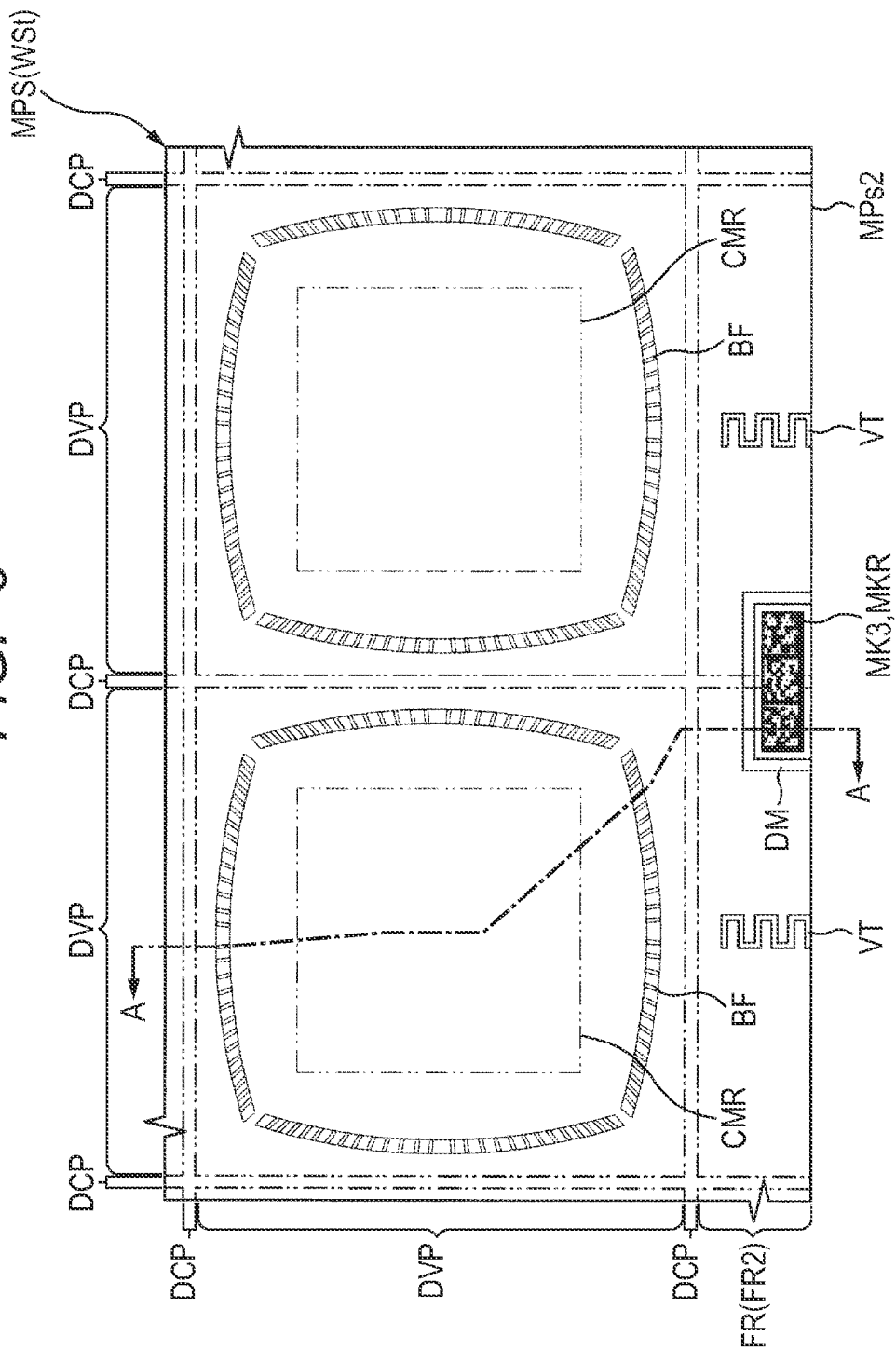
FIG. 6 is an enlarged plan view of A portion of FIG. 5.
Figure 7:
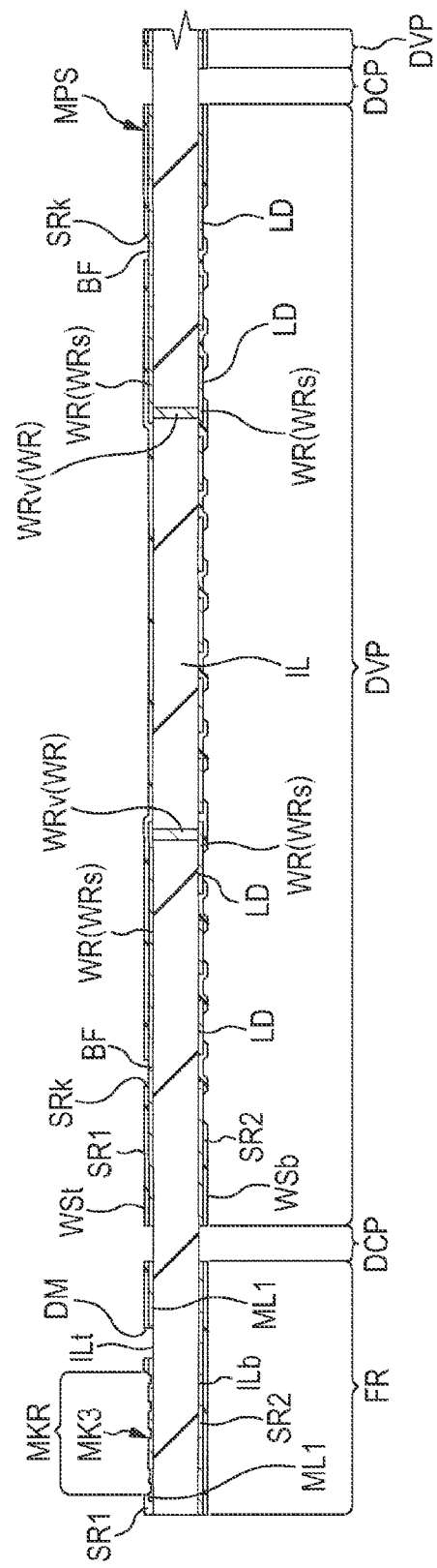
FIG. 7 is an enlarged cross-sectional view taken along line A-A of FIG. 6.

First, in a base material providing step shown in FIG. 4, a wiring substrate MPS shown in FIGS. 5 and 6 is provided. FIG. 5 is a plan view showing an entire configuration of the wiring substrate provided in the base material providing step shown in FIG. 4. Further, FIG. 6 is an enlarged plan view of A portion of FIG. 5. Still further, FIG. 7 is an enlarged cross-sectional view taken along line A-A of FIG. 6. Also, in FIG. 5, in order to specify a frame region FR surrounding a circumference of the device regions DVP, patterns are given to the frame region FR.

As shown in FIG. 5, the wiring substrate MPS provided in this step has the device regions DVP inside the frame region FR. Specifically, the device regions DVP are arranged in a matrix shape. In other words, the wiring substrate MPS has the frame region FR outside the device regions DVP. Although the number of the device regions DVP is not limited to that of the mode shown in FIG. 5, the wiring substrate MPS of the present embodiment includes, for instance, 48 device regions DVP arranged in the matrix shape (4 lines×12 rows in FIG. 5). That is, the wiring substrate MPS is a so-called multi-piece substrate which has the device regions DVP.

Moreover, around each of the device regions DVP, there is provided a dicing region (dicing line) DCP which is to be a region where the wiring substrate MPS is cut in a division-into-pieces step shown in FIG. 4. As shown in FIG. 5, the dicing region DCP is arranged between the adjacent device regions DVP and between the frame region FR and the device region DVP.

Each device region DVP corresponds to the wiring substrate WS shown in FIGS. 2 and 3. In each device region DVP of the wiring substrate MPS provided in this step, the chip mounting region CMR (see FIG. 6) is provided on the side of the upper surface (surface, chip mounting surface) WSt. Further, around the chip mounting region CMR, there are formed the terminals BF (see FIG. 6) exposed from the insulating film SR1. Moreover, the lands (terminals, external terminals) LD are formed over the lower surface (back surface, packaging surface) WSb on the opposite side of the upper surface WSt of the device region DVP. In this step, the solder balls SB shown in FIG. 2 are not coupled to the lands LD, and each of the lands LD is exposed from the insulating film SR2.

Moreover, the frame region FR is a vacant region where each of the members configuring the semiconductor device PKG1 shown in FIGS. 1 to 3 is not formed. The frame region FR is used as a processing table when the members for the semiconductor device are assembled over the wiring substrate MPS. Moreover, though not left in the semiconductor device PKG1 being a completed product, there are formed members used in a manufacturing step shown in FIG. 4.

As shown in FIG. 5, the wiring substrate MPS is quadrangular in a plane view. Further, the wiring substrate MPS has, in its outer edge portion, a side MPs1 extending in X-direction, a side MPs2 opposed to the side MPs1, a side MPs3 extending in Y-direction orthogonal to X-direction, and a side MPs4 opposed to the side MPs3. In the example shown in FIG. 5, the wiring substrate MPS is rectangular in a plan view. Also, the sides MPs1 and MPs2 are long sides, and the sides MPs3 and MPs4 are short sides. Each of the device regions DVP is quadrangular in a plan view. Further, the device regions DVP are formed in a matrix shape along respective sides MPs1 and MPs3.

Moreover, the frame region FR includes: a region FR1 between the side MPs1 and the device regions DVP; a region FR2 between the side MPs2 and the device regions DVP; a region FR3 between the side MPs3 and the device regions DVP; and a region FR4 between the side MPs4 and the device regions DVP.

Moreover, as shown in FIG. 5, in the region FR1 on the side of the side MPs1 of the wiring substrate MPS, a plurality of gate patterns GTp are formed. Moreover, in the region FR2 on the side of the side MPs2 of the wiring substrate MPS, a plurality of vent patterns VTp are formed. The gate patterns GTp are metal patterns exposed from the insulating film SR1 shown in FIG. 7. The gate pattern GTp is formed in the center of each row of the device regions DVP. Moreover, the vent patterns VTp are trench patterns formed in the insulating film SR1 shown in FIG. 7, and are formed at positions opposed to the gate patterns GTp.

Though described in detail later, in a sealing step shown in FIG. 4, the sealing body is formed by a so-called transfer mold method in which a resin is supplied into a molding apparatus and cured. The resin for sealing is supplied from the side of the side MPs1 of the wiring substrate MPS. A gas inside the molding apparatus is discharged from the side of the side MPs2 of the wiring substrate MPS. The gate pattern GTp is so formed as to allow a gate resin formed in a gate part being a supply port of the resin to peel off easily. Moreover, the vent pattern VTp is so formed as to control the direction in which the gas in the molding apparatus is discharged.

Further, as shown in FIG. 5, onto the wiring substrate MPS of the present embodiment, there is affixed a code (identification information, encrypted identification information) MK3 which is a graphic symbol where information is encrypted. The code MK3 is a graphic symbol where there is encrypted a substrate ID which is unique information, when processing is applied to the wiring substrates MPS, for identifying each wiring substrate MPS. The code MK3 is formed in a marking region MKR provided in part of the frame region FR. In the example shown in FIG. 5, the marking region MKR in which the mark MK3 is formed is provided in part of the region FR2, of the frame region FR, between the side MPs2 of the wiring substrate MPS and the device regions DVP. According to the present embodiment, a description will be made as to a case where the code (identification information) MK3 is affixed to the wiring substrate MPS in advance. However, the code MK3 may be formed in this step.

The code MK3 is an identification symbol which makes it possible, in each manufacturing step shown in FIG. 4, to trace historical data of parts mounted onto the wiring substrate MPS and historical data of processing applied to each device region DVP of the wiring substrate MPS. Therefore, the code MK3 is formed at a position where the sealing body is not formed so that the code MK3 can be read after the sealing body has been formed over the wiring substrate MPS.

Moreover, the code MK3 is so provided as to identify the wiring substrates MPS. Therefore, it can be character information like the mark MK1 shown in FIG. 1. However, it may be graphic information so as to increase the amount of information per unit area. Therefore, in terms of reducing the area of the marking region MKR, it is preferable to form the graphic information. Moreover, like the code MK3 shown in FIG. 6, in the case of the two-dimensional code having information in X-direction and Y-direction, in particular, it is possible to reduce the area of the marking region MKR.

In the example shown in FIG. 5, the code MK3 is a graphic symbol based on an encryption rule different from that of the code MK2 of FIG. 1. However, like the cut-away symbol of the code MK2, it includes an alignment mark for detecting a position or orientation of the code MK3. Also, for instance, the code MK3 may include an error-correcting code (for instance, an error-correcting code called a "Reed-Solomon code").

Moreover, the code MK3 of the present embodiment is an engraved mark which can be identified by, for instance, radiating a laser beam to a metal layer ML1 formed in a lower layer of the insulating film SR1 and forming concave and convex portions in an exposed surface of the metal layer ML1. The metal layer ML1 can be exposed by radiating the laser beam to the insulating film SR1.

In addition, the code MK3 is not limited to the above mode if information of the code MK3 can be correctly read. For instance, concave and convex portions may be formed in the insulating film SR1. In this case, the metal layer ML1 is not required to be formed in the lower layer of the insulating film SR1, making it possible to reduce materials used for the wiring substrate MPS. However, when considering easiness of reading the code MK3, it is preferable to form the metal layer ML1 in the marking region MKR so that a difference may be distinct in the amount of reflected light and the metal layer ML1 may be exposed from the insulating film SR1.

Moreover, of the frame region FR, there is formed a dam part DM between the marking region MKR and the device regions DVP. According to the present embodiment, the dam part DM is a trench formed by removing the insulating film SR1 and is so formed as to surround the marking region MKR.

Though details will be described later, by forming the dam part DM between the marking region MKR and the device regions DVP, in the sealing step, it becomes possible to read the code MK3 even when the resin leaks around a main body of the sealing body.

The code MK 3 shown in FIG. 5 is formed in the manufacturing step of the wiring substrate MPS, and the substrate ID is stored in a main server shown in FIG. 10 to be described later. In addition, if the wiring substrate MPS is a purchased part, for instance, in this step or before the die bonding process of the following die bonding step, the substrate ID is registered after the code MK3 has been read.

<Die Bonding Step>

Figure 8:
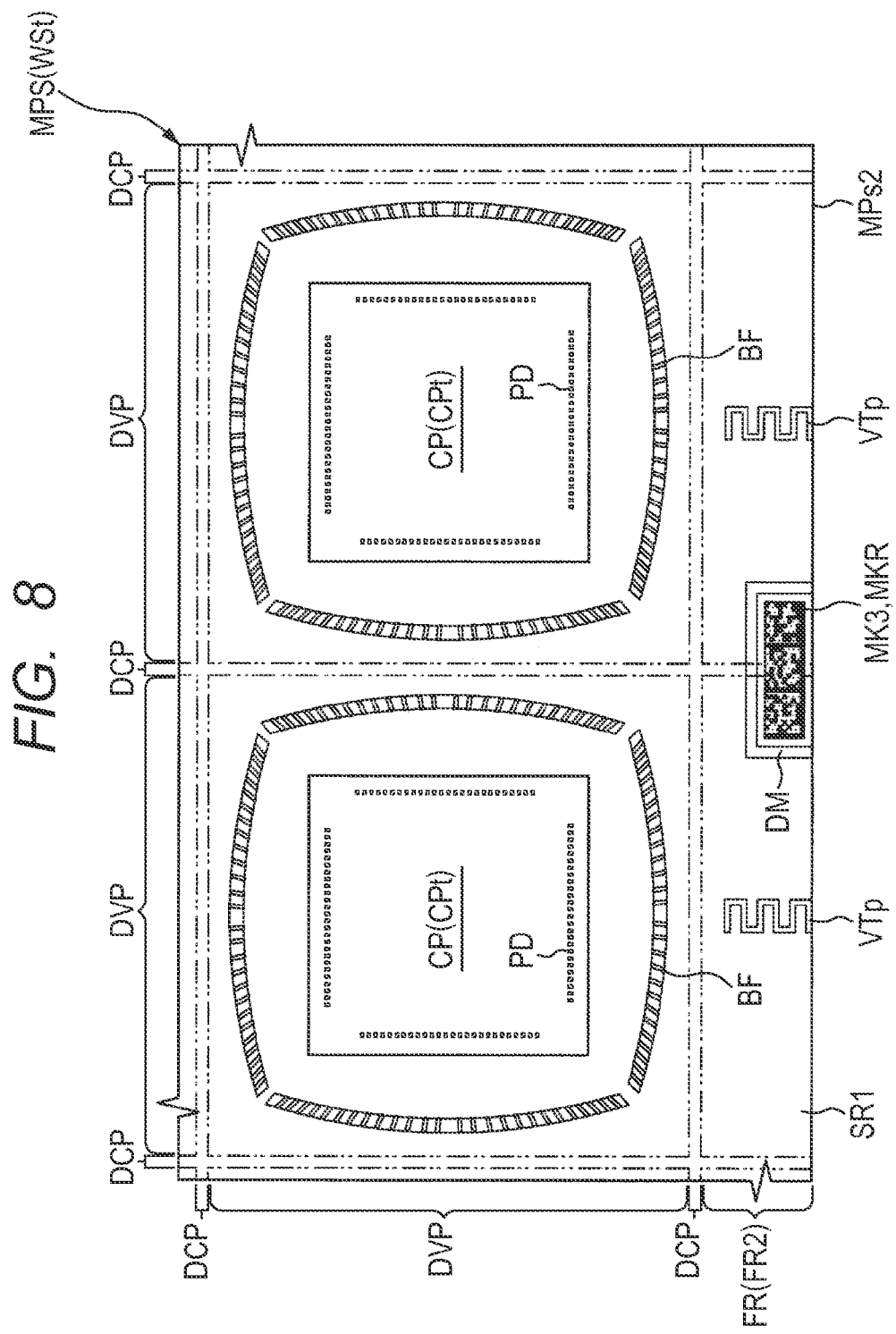
FIG. 8 is an enlarged plan view showing a state where a plurality of semiconductor chips are mounted over the wiring substrate shown in FIG. 6.
Figure 9:
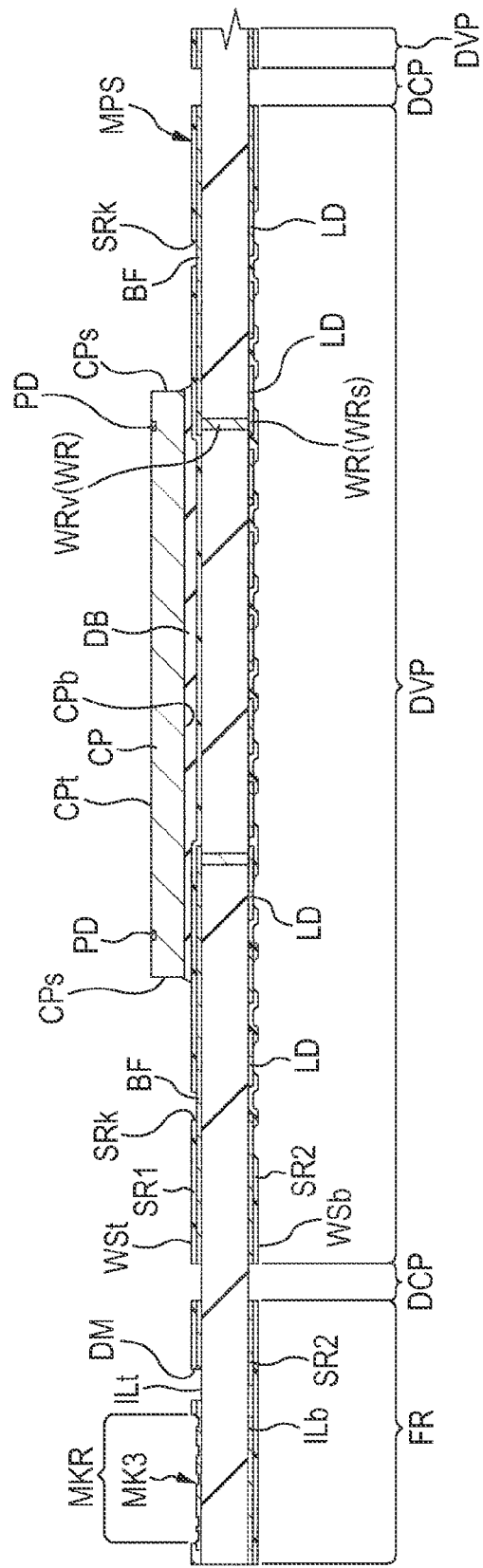
FIG. 9 is an enlarged cross-sectional view showing a state where the semiconductor chips are mounted over the wiring substrate shown in FIG. 7.

Next, in the die bonding step shown in FIG. 4, as shown in FIG. 8, the semiconductor chips CP are mounted in the device regions DVP. FIG. 8 is an enlarged plan view showing a state where the semiconductor chips are mounted over the wiring substrate shown in FIG. 6. Further, FIG. 9 is an enlarged cross-sectional view showing a state where the semiconductor chip is mounted over the wiring substrate shown in FIG. 7. Still further, FIG. 10 is an explanatory view schematically showing the die bonding step shown in FIG. 4 in detail.

In this step, as shown in FIGS. 8 and 9, the semiconductor chip CP is mounted onto the upper surface WSt, which is a chip mounting surface of the wiring substrate MPS. The Semiconductor chip CP includes: a surface CPt over which the pads PD are formed; and a back surface CPb (see FIG. 9) located on the opposite side of the surface CPt. In the example of the present embodiment, the semiconductor chip CP is mounted onto the wiring substrate MPS by a so-called face-up packaging method in which the back surface CPb is opposed to the upper surface WSt of the wiring substrate MPS. Moreover, in the example shown in FIG. 9, the semiconductor chip CP is adhesively fixed to the wiring substrate MPS through an adhesive DB. The adhesive DB contains, for instance, a thermosetting resin, such as an epoxy resin.

Figure 10:
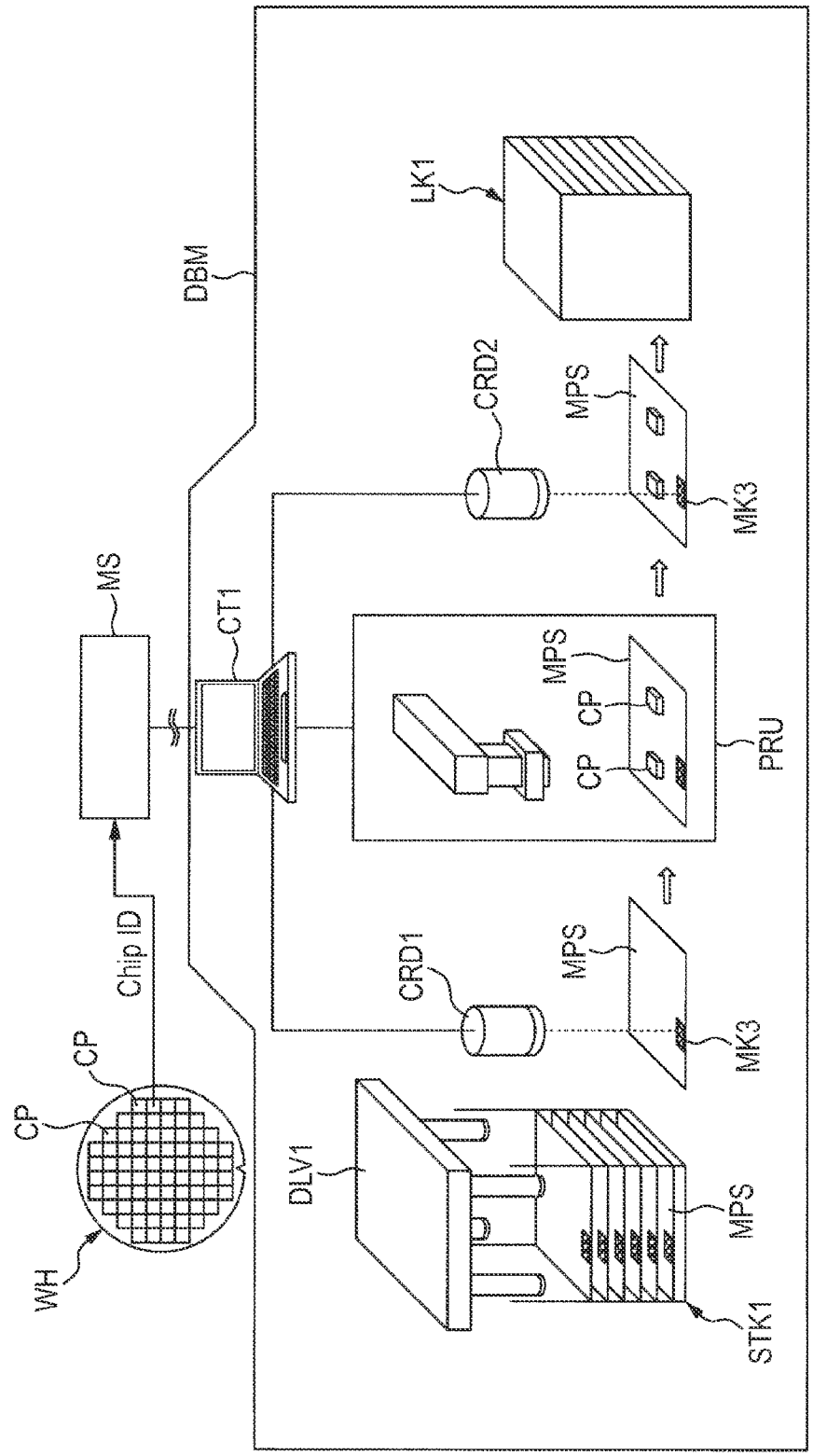
FIG. 10 is an explanatory view schematically showing details of a die bonding step shown in FIG. 4.

Moreover, as schematically shown in FIG. 10, the die bonding step of the present embodiment includes a step where, before or after the semiconductor chip CP is mounted onto the wiring substrate MPS, the code MK3 affixed to the wiring substrate MPS is read, and thus read information (according to the present embodiment, a substrate ID being unique information of the wiring substrate MPS) is stored in a main server MS having a memory. Hereafter, a description thereof will be made with reference to FIG. 10.

The semiconductor wafer WH shown in FIG. 10 has gone through a wafer process for forming an integrated circuit over the semiconductor substrate and a division-into-pieces step, and is in a state of being divided into a plurality of semiconductor chips CP.

The wafer process of the semiconductor device includes a plurality of steps in which an integrated circuit is formed in each semiconductor chip (semiconductor chip before divided into pieces) of the semiconductor wafer WH by combining a photolithography technique, a CVD technique, a sputtering technique, and an etching technique. Moreover, the wafer process includes an electrical characteristic testing step where a probe is brought into contact with a surface of the pad PD (see FIG. 8) formed over a main surface (surface where the integrated circuit is formed) of each semiconductor chip CP, and a check is made to see whether elements configuring the integrated circuit are defective or non-defective and whether a wiring for coupling the elements is conducted or not.

Moreover, the step of dividing the semiconductor chip CP into pieces is a step where a dicing tape is put on a back surface (surface opposite to the main surface) of the semiconductor wafer WH which has gone through the electrical characteristic testing step and, in this state, the semiconductor wafer WH is cut to obtain a plurality of semiconductor chips CP. The semiconductor chips CP which are made by dividing the semiconductor wafer WH into pieces are conveyed to the die bonding step in a state of being held by the above dicing tape.

In a pre-process, to each of the semiconductor chips CP which have been made by dividing the semiconductor wafer WH into pieces, there is affixed unique information as to production lot number of the semiconductor wafer WH, semiconductor wafer number, position of the semiconductor chip CP concerned in the semiconductor wafer WH, and whether the semiconductor chip CP is non-defective or defective, namely a chip ID (chip identification information) tied to each piece of individual information. After the semiconductor wafer WH (semiconductor chips CP divided into pieces) has been conveyed to the die bonding step, the chip ID of each semiconductor chip CP is read and stored in the main server MS being a memory.

That is, test results about the quality in the above electrical characteristic testing step are correlated (tied) together with the chip ID (chip identification information, identification information, identification code), production lot number of the semiconductor wafer, wafer number in the production lot, and position information inside the semiconductor wafer WH, and are stored in the main server MS.

Therefore, by making reference to the main server MS, it is possible to easily (quickly) obtain information as to in which production lot each semiconductor chip CP was manufactured and on which semiconductor wafer WH and in which position it was located.

Moreover, as shown in FIG. 10, a code reader CRD1 is installed (arranged) in a loading part (between the loading part and a processing unit PRU, on a conveyance route from the loading part to the processing unit PRU) of the die bonding device DBM where the die bonding step of the present embodiment is conducted. Moreover, a code reader CRD2 is installed (arranged) in an unloading part (between the processing unit PRU and the unloading part, on a conveyance route from the processing unit PRU to the unloading part) of the die bonding device DBM.

The code reader CRD1 and the code reader CRD2 are ID readers which read two-dimensional codes affixed to the wiring substrate MPS and are coupled to a server (control server CT1) for managing the die bonding step. Moreover, the control server CT1 is coupled to the main server MS in which the chip ID is stored.

In the die bonding step, there is set, in the loading part of the die bonding device DBM, a stacker STK1 which is a receiving part where the wiring substrates MPS are stored (stacked). Then, the wiring substrates MPS are taken one by one out of the stacker STK1 by a delivery jig DLV1. In addition, when the ID management of the stacker STK1 is conducted, a step of reading the ID of the stacker STK1 may be added.

Next, the code MK3 of the wiring substrate MPS discharged from the stacker STK1 is read using the above-described code reader CRD1 of the loading part. The thus read information, namely, the unique information (substrate ID) of the wiring substrate MPS is transferred to the control server CT1. In this way, by reading the code MK3 of the wiring substrate MPS before mounting the semiconductor chip CP, it is possible to determine whether or not it is suitable as a base material (wiring substrate MPS) supplied for production of the product (production lot) to be manufactured in this step. For instance, by comparing data (conversion table) recorded in advance on the main server MS with the read substrate ID, it is determined whether or not the base material is the one applicable for the requested product name (production lot) to be produced.

After that, the wiring substrate MPS is supplied (conveyed) to the processing unit PRU (region between the loading part and the unloading part) of the die bonding apparatus DBM, and is set inside the processing unit PRU. In addition, in the above process, when it is determined as a different base material (non-applicable article), the supply (discharge, conveyance) of the base material is stopped.

Next, the wiring substrate MPS is supplied to the processing unit PRU of the die bonding device DBM, and the die bonding process is conducted. According to the present embodiment, for instance, the adhesive DB shown in FIG. 9 is supplied to each of the chip mounting regions CMR shown in FIG. 6. In this regard, when the supplied wiring substrate MPS has a defective device region DVP and, further, information about the defective device region DVP is also store in the main server MS, the adhesives DB can be supplied by choosing non-defective device regions DVP only. Therefore, the amount of usage of the material (adhesive DB, in this case) can be reduced, thereby lowering the manufacturing cost.

Next, the semiconductor chips CP made by dividing the semiconductor wafer WH into pieces are picked up one by one and arranged in the chip mounting region of the wiring substrate MPS. In this regard, as in the case described above, when the information about defective device regions DVP is also stored in the main server Ms, the semiconductor chips CP can be arranged by choosing non-defective device regions DVP only, thereby improving the yield of production.

Next, after pressing the semiconductor chip CP against the wiring substrate MPS to extend the adhesive DB, the semiconductor chip CP is adhesively fixed by curing the adhesive DB. With regard to the step of curing the adhesive DB, the semiconductor chip CP can also be arranged in each of the device regions DVP and then cured collectively.

Next, when completion of the die bonding of the semiconductor chip CP is confirmed, results of the process are stored in the main server MS through the control server CT1. At this point, the chip ID being unique information of the semiconductor chip CP, the substrate ID being unique information of the wiring substrate MPS, and conditions of the process are tied to one another. For instance, it is recorded that the semiconductor chip CP having a chip ID "WH001X01Y01" is arranged at a location "X01Y01" in the wiring substrate MPS whose substrate ID is "K001" based on a processing recipe (RE001) by the die bonding device DBM.

In addition, when the semiconductor chip CP is mounted onto the wiring substrate MPS, there is referred to the chip ID of the semiconductor chip CP stored in the main server MS in advance, and a check is made to see whether or not the semiconductor chip CP is determined to be non-defective in the electrical characteristic test in the pre-process. When the semiconductor chip CP has been determined to be defective, the semiconductor chip CP concerned is not mounted onto the wiring substrate MPS.

Then, in the wiring substrate MPS, the position where the semiconductor chip is arranged is checked. In the same wiring substrate MPS, when it is determined that it is in a state where additional semiconductor chips CP can be arranged (a state where there are device regions DVP in which semiconductor chips are not arranged), the process is advanced to a next process target position in the wiring substrate MPS and the die bonding is repeated.

On the other hand, when it is determined that all the processing (in this case, the die bonding) to the same wiring substrate MPS is over, a first wiring substrate MPS having gone through the die bonding is conveyed to the unloading part from the processing unit PRU of the die bonding device DBM. In addition, when collectively curing the adhesive DB shown in FIG. 9, the wiring substrate MPS is conveyed to a baking furnace inside the apparatus before being conveyed to the unloading part, and the adhesive DB is cured in a high-temperature atmosphere.

Subsequently, the code MK3 of the wiring substrate MPS is read using the code reader CRD2 of the unloading part. Then, reference is made to the main server MS about the substrate ID through the control server CT1. As a result of the reference, when it is confirmed that the substrate ID corresponds to the substrate ID read using the code reader CRD1 of the loading part, the control server CT1 permits the wiring substrate MPS to be received in a rack LK1.

Further, as a result of the above reference, when it is confirmed that the substrate ID does not correspond to the substrate ID read by the code reader CRD1 of the loading part, the state is determined to be abnormal and the process is discontinued. That is, the die bonding is stopped and contents of the error are displayed on a monitor.

The wiring substrate MPS having gone through the die bonding step is received in the rack LK1, and the result of receiving the wiring substrate MPS is stored in the main server MS through the control server CT1. After that, a check is made to see if the rack LK1 is full or not. When it is determined that the rack LK1 is not full, that is, the rack LK1 is capable of receiving some more wiring substrates MPS, the process of receiving into the rack LK1 is repeated until it is determined that the rack LK1 is full.

In addition, in the example shown in FIG. 10, identification information is not affixed to the rack LK1. However, as a modification, identification information may be affixed to the rack LK1. In such a case, historical data of production can be managed per rack LK1 unit by reading the code made by symbolizing the identification information affixed to the rack LK1 and storing it in the main server MS through the control server CT1.

<Wire Bonding Step>

Figure 11:
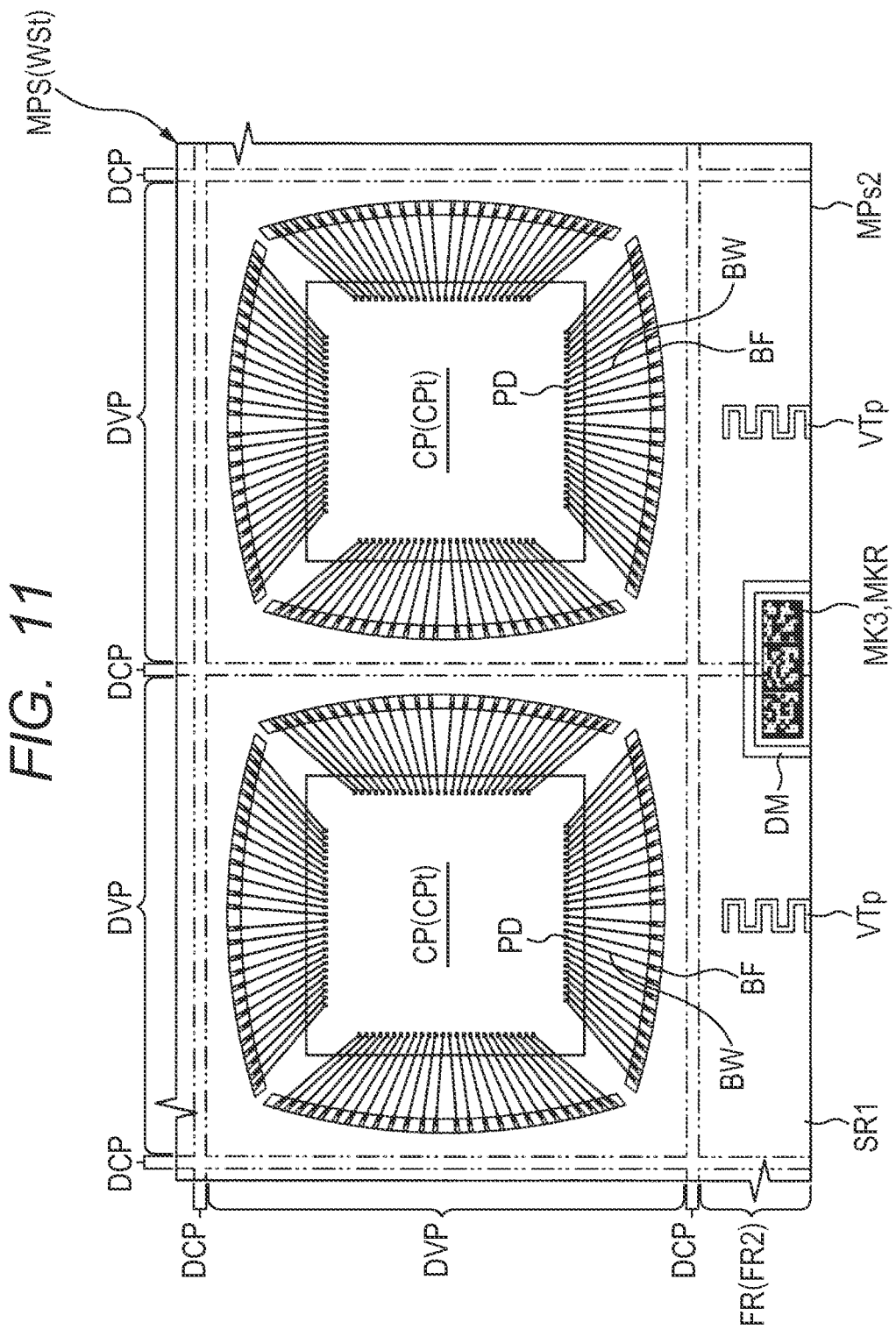
FIG. 11 is an enlarged plan view showing a state where the semiconductor chips and terminals of the wiring substrate shown in FIG. 8 are electrically coupled through wires.

Next, in a wire bonding step shown in FIG. 4, as shown in FIG. 11, the pads PD formed over a surface CPt of the semiconductor chip CP are electrically coupled with the terminals BF arranged around the semiconductor chip CP, respectively, through the wires (conductive members) BW. FIG. 11 is an enlarged plan view showing a state where the semiconductor chip and the terminals of the wiring substrate shown in FIG. 8 are electrically coupled through the wires. Moreover, FIG. 12 is an enlarged plan view showing a state where the semiconductor chips and the terminals of the wiring substrate shown in FIG. 9 are electrically coupled through the wires.

Figure 12:
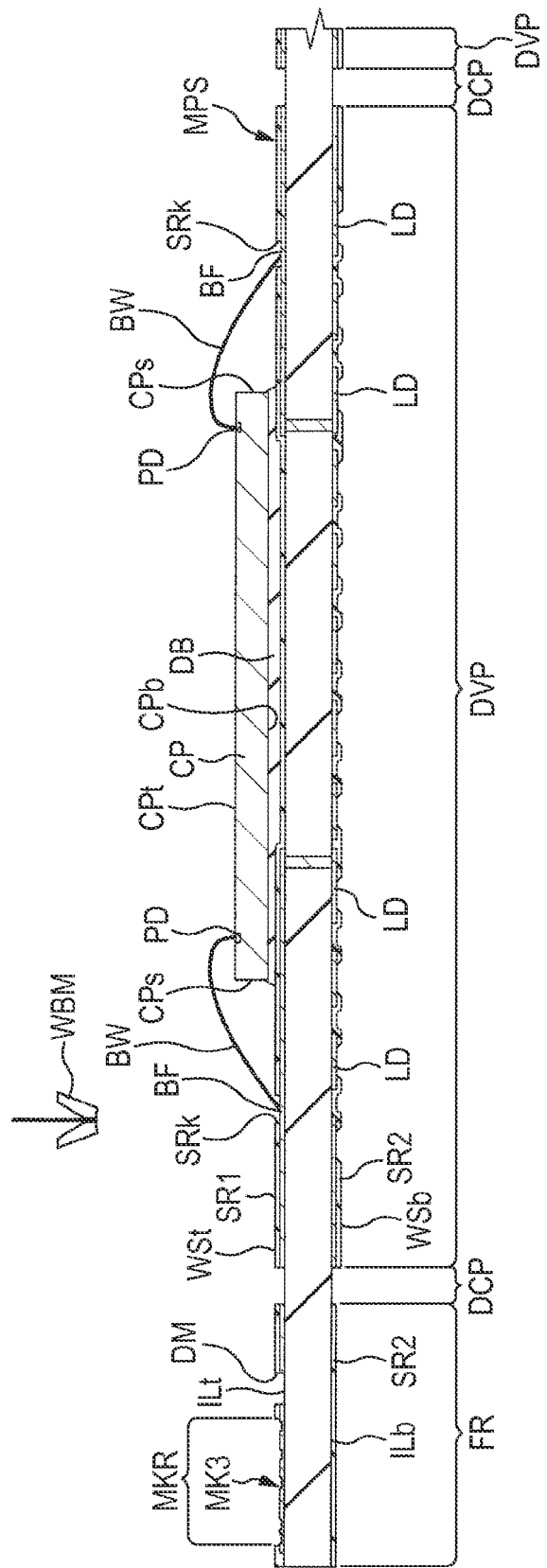
FIG. 12 is an enlarged plan view showing a state where the semiconductor chips and the terminals of the wiring substrate shown in FIG. 9 are electrically coupled through the wires.

In this step, with use of the wire bonding device WBM illustrated in FIG. 12, one end of a metal wire BW of gold (Au) or copper (Cu), for instance, is joined to the pad PD of the semiconductor chip CP, and the other end is joined to the terminal BF of the wiring substrate MPS. As a joining method, for instance, there can be adopted a method where ultrasound is applied to a joint and a metal bond is formed, a method of thermo-compression bonding, or a method of combining ultrasound and thermo-compression bonding. In addition, in FIG. 12, as an example of the wire bonding method, there is shown a method with use of a so-called normal bonding where part (one end) of the wire BW is first coupled to the pad PD. However, as a modification, it may be a so-called reverse bonding method by which the terminal BF is coupled with one end of the wire BW first.

Moreover, when using a gold wire BW, in terms of reducing the amount of usage of the expensive material, it is preferable to use the wire BW having a smaller diameter. Also, the diameter of the wire BW of the present embodiment is, for instance, 23 μm to 25 μm.

Moreover, though not shown, as in the method explained with reference to FIG. 10 in the above die bonding step, the wire bonding step of the present embodiment includes a step in which, before or after the wire bonding, the code MK3 affixed to the wiring substrate MPS is read, and the thus read information (substrate ID) is stored in the main server MS having a memory.

Therefore, according to the present embodiment, when completion of the wire bonding is confirmed, results of the process are stored in the main server MS through the control server CT1. At this point, the chip ID being unique information of the semiconductor chip CP, the substrate ID being unique information of the wiring substrate MPS, and conditions of the wire bonding in the wire bonding step are tied to one another. For instance, it is recorded that the semiconductor chip CP having a chip ID "WH001X01Y01" mounted at a location "X01Y01" in the wiring substrate MPS whose substrate ID is "K001" has gone through wire bonding based on a wire bonding method (RWB001) using a wire (W001) by the wire bonding device WBM.

<Sealing Step>

Figure 13:
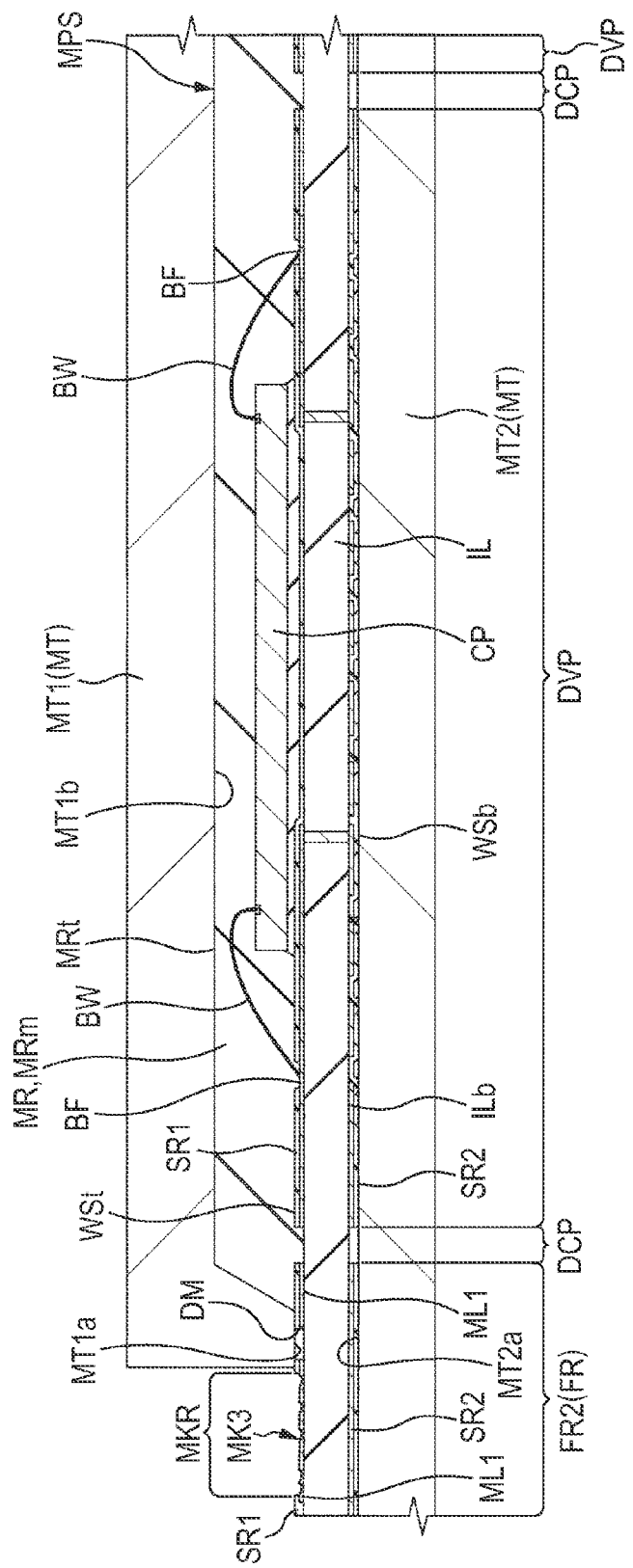
FIG. 13 is an enlarged cross-sectional view showing a state, with a plurality of device forming regions shown in FIG. 12 being held in a molding apparatus, a resin is supplied into a cavity of the molding apparatus.

Next, in a sealing step shown in FIG. 4, each part of the semiconductor chip CP, the wires BW, and the terminals BF shown in FIG. 12 (is) are sealed with resin to form (the) a sealing body MR shown in FIG. 13.

Figure 14:
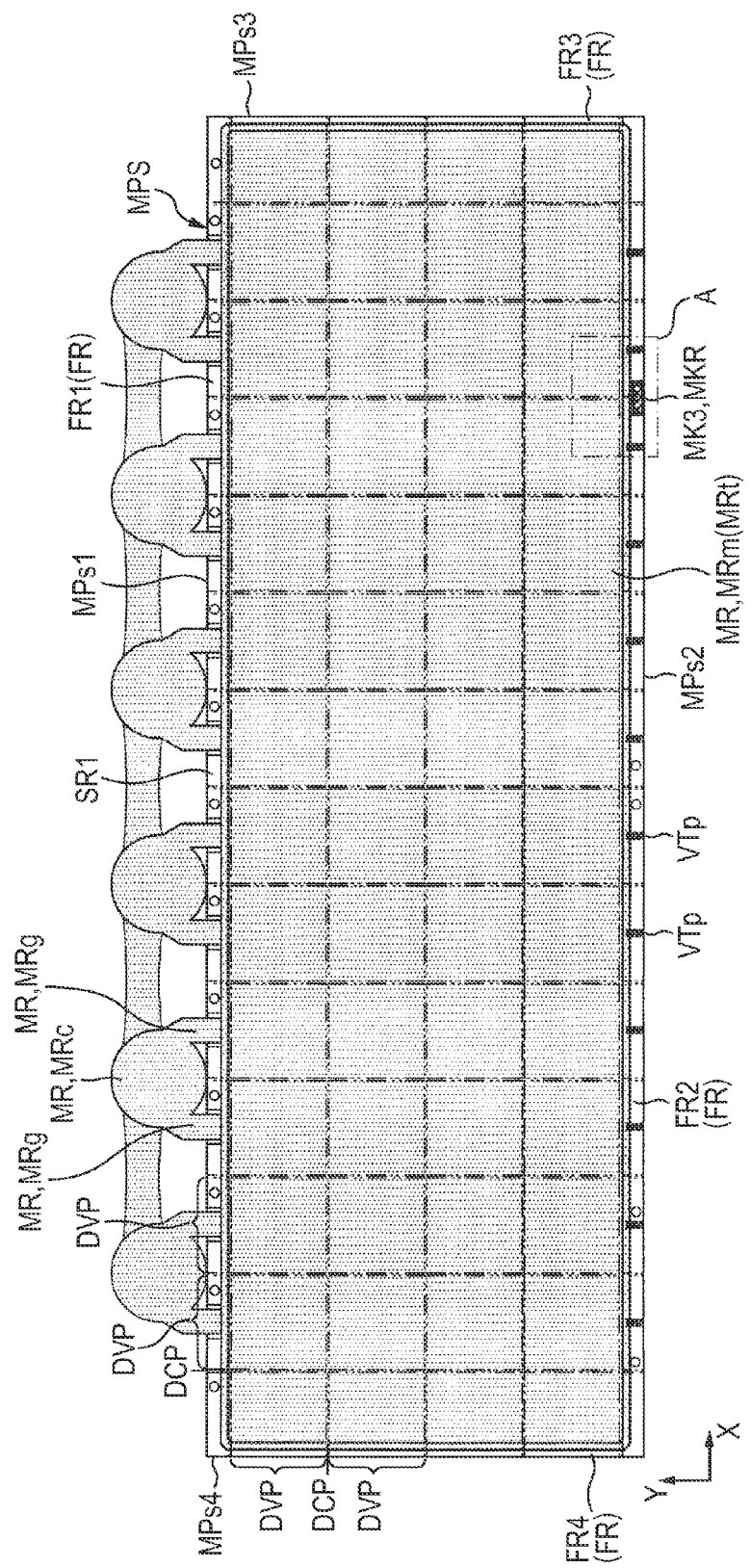
FIG. 14 is a plan view showing an entire configuration of a state where the wiring substrate is taken out of the molding apparatus shown in FIG. 13.
Figure 15:
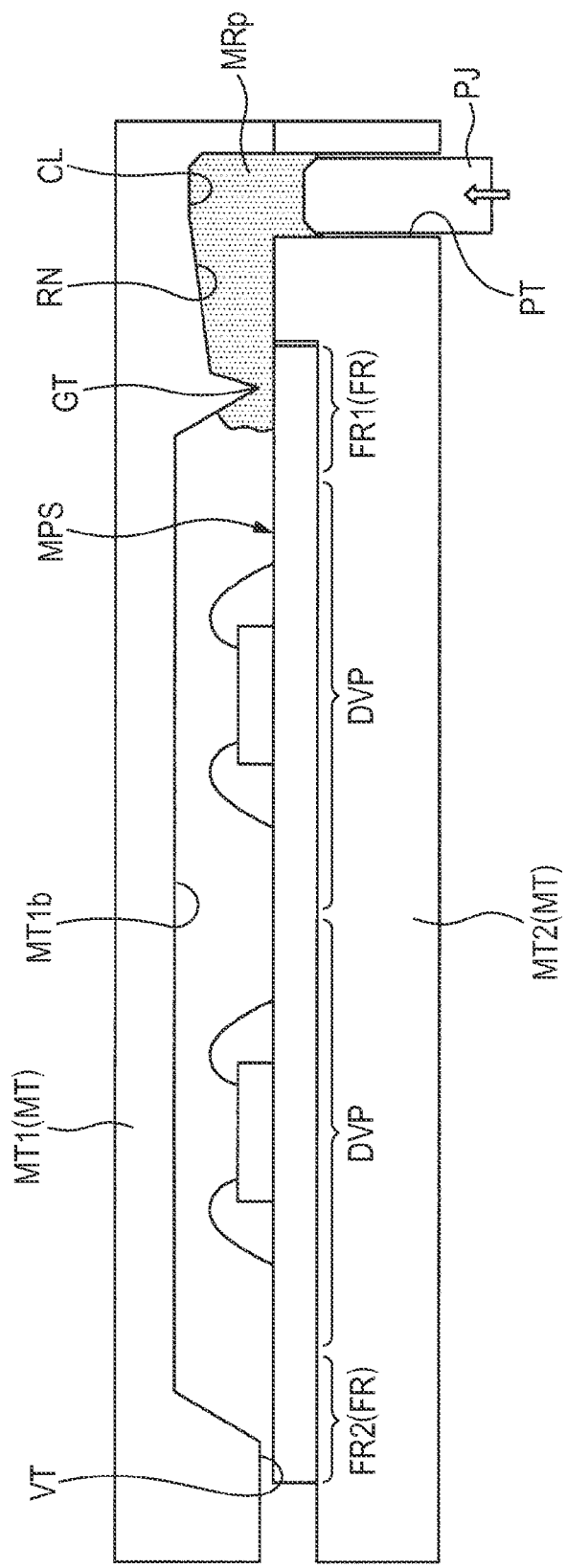
FIG. 15 is an explanatory view schematically showing a configuration of the molding apparatus shown in FIG. 13 in a cross-sectional view.
Figure 16:
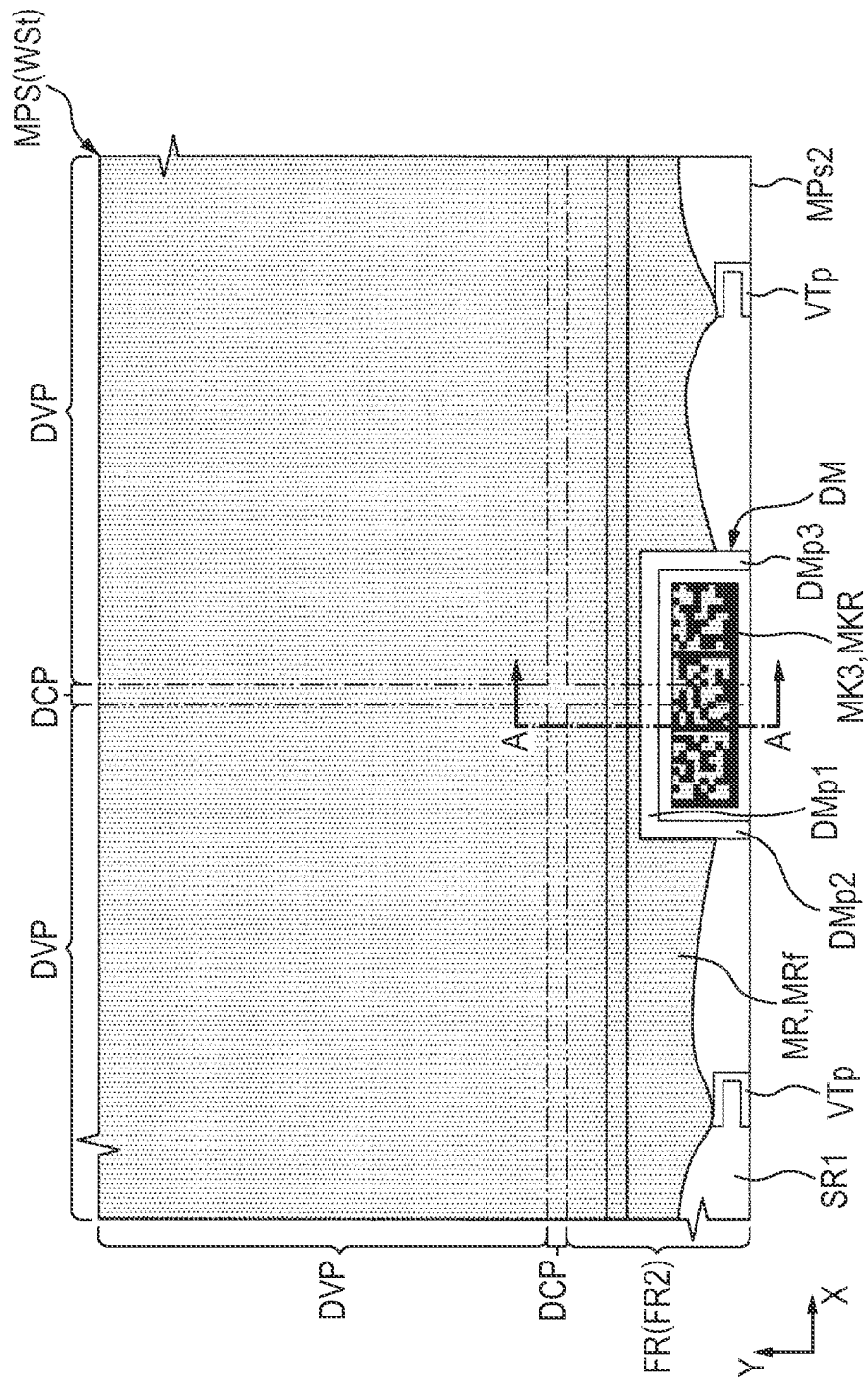
FIG. 16 is an enlarged plan view of A portion of FIG. 14.

FIG. 13 is an enlarged cross-sectional view showing a state where, with a plurality of device forming regions shown in FIG. 12 being held in a molding apparatus, a resin is supplied into the cavity of the molding apparatus. Further, FIG. 14 is a plan view showing an entire configuration of a state where the wiring substrate is taken out of the molding apparatus shown in FIG. 13. Still further, FIG. 15 is an explanatory view schematically showing a configuration of the molding apparatus shown in FIG. 13 in a cross-sectional view. Still further, FIG. 16 is an enlarged plan view of A portion of FIG. 14.

In this step, the sealing body MR is formed in each of the device regions DVP, and the semiconductor chip CP, the wires BW, and the terminals BF shown in FIG. 12 are sealed with a resin.

Moreover, in the example shown in FIG. 13, with use of the molding apparatus MT having an upper mold (first metal mold) MT1 and a lower mold (second metal mold) MT2, the sealing body MR is formed by a so-called transfer mold method. Specifically, in this step, with the wiring substrate MPS being held in the molding apparatus MT, after softened resin is poured into the molding apparatus MT by pressure, the sealing body MR is formed by curing the resin. Then, when the wiring substrate MPS is peeled off the molding apparatus MT, as shown in FIG. 14, the wiring substrate MPS with the sealing body MR formed thereon is obtained in each of the device regions DVP.

The upper mold MT1 of the molding apparatus MT includes: a metal mold face (also called a "clamp face") MT1a; and a cavity (also called a "concave portion") MT1b formed in the metal mold face MT1a. Moreover, the lower mold MT2 has a metal mold face (clamp face) MT2a which is opposed to the metal mold face MT1a of the upper mold MT1. In addition, according to the present embodiment, a sealing body MR is formed on the side of the upper surface WSt of the wiring substrate MPS but a sealing body MR is not formed on the side of the lower surface WSb. Therefore, a concave portion like the cavity MT1b is not formed in the lower mold MT2 and it covers the entire lower surface WSb of the wiring substrate MPS.

Moreover, as shown in FIG. 15, the molding apparatus MT has a pot portion PT for receiving a resin tablet. As shown by arrow in FIG. 15, it has a plunger PJ inserted into the pot portion PT and moving from the lower mold MT2 side toward the upper mold MT1 side. Further, in a position opposed to the pot portion, there is provided a space called cal CL. Still further, the upper mold MT1 of the molding apparatus MT has a gate part GT which is in communication with the cal CL through a runner part RN. The gate part GT is also in communication with the cavity MT1b and is located between the cavity MT1b and the runner part RN. The gate part GT is a supply port for supplying resin MRp into the cavity MT1b. In the gate part GT, there is a gap between the upper mold MT1 and the wiring substrate MPS. Further, the upper mold MT1 of the molding apparatus MT has a vent part VT through which gas such as air left in a space inside the molding apparatus is discharged. The vent part VT and the gate part GT are provided at different locations. In an example shown in FIG. 15, the gate part GT and the vent part VT are provided in an opposed manner with the cavity MT1b in between. Moreover, the vent part VT is in communication with the cavity MT1b.

In a state where the wiring substrate MPS is arranged between the upper mold MT1 and the lower mold MT2 shown in FIG. 15, when the upper mold MT1 and the lower mold MT2 are assembled, as shown in FIG. 15, a space is formed between the pot portion PT and the cal CL. Moreover, a hollow space is formed between the cavity MT1b and the wiring substrate MPS. The wiring substrate MPS is positioned such that the semiconductor chip CP may be located in the hollow space, and is held (clamped) between the metal mold face MT1a of the upper mold MT1 and the metal mold face MT2a of lower mold MT2 shown in FIG. 13.

Moreover, according to the present embodiment, the device regions DVP are so provided as to be positioned in one cavity MT1b, and a sealing body MR for sealing the device regions DVP collectively is formed. The sealing method of forming the sealing body MR for collectively covering the device regions DVP like this is called a MAP (Mold Array Process) method, which can reduce a plane size of the device region DVP as compared with a piece molding method of forming a sealing body MR for each device region DVP. In addition, as a modification of the present embodiment, the above piece molding method may be applied.

The resin tablet is received in the pot portion PT and, in the sealing step, the resin tablet is softened by heating the molding apparatus to obtain the paste-like resin MRp. With the resin MRp being softened, when the plunger PJ is lifted toward the cal CL, the resin MRp is supplied into the cavity MT1b through the runner part RN and the gate part GT.

As described above, the resin MRp contains numbers of filler grains such as thermosetting resin like an epoxy resin, a curing agent, and silica. The fluidity of the resin supplied into the cavity MT1b can be adjusted according to the percentage of the filler grains contained. When the fluidity of the resin is high, a supply pressure can be reduced. On the other hand, when the fluidity of the resin is low, by raising the supply pressure of the resin to the cavity MT1b, it is possible to prevent regions from being resin-unfilled.

Moreover, when the resin MRp is supplied into the cavity MT1b, the gas inside the cavity MT1b is discharged from the vent part VT. Thus, by providing the vent part VT in communication with the cavity MT1b, the cavity MT1b is prevented from having unfilled regions therein.

Moreover, when the space inside the cavity MT1b is filled with the resin MRp, part of the excessive resin MRp is discharged from the vent part VT. Thus, by continuing the supply of the resin MRp until part of the resin MRp is discharged from the vent part VT, the cavity MT1b is prevented from having unfilled regions therein.

Moreover, as shown in FIGS. 8 and 11, of the frame region FR of the wiring substrate MPS, in the region FR2 on the vent side, at a position overlapping the vent part VT shown in FIG. 15, a vent pattern VTp is formed. The vent pattern VTp is a trench pattern formed by removing the insulating film SR1 and, in the example shown in FIG. 8, it extends toward the outer edge portion of the wiring substrate MPS while meandering in a rectangular form.

In the sealing body MR thus formed, as shown in FIG. 14, other than the main body MRm covering the device regions DVP, there are formed: a gate resin part MRg formed in the gate part GT (see FIG. 15) and the runner part RN (see FIG. 15); and a cal resin part MRc formed in the cal CL (see FIG. 15). In the example shown in FIG. 14, the gate resin part MRg is formed for each row of the device regions DVP. Moreover, over the upper surface WSt of the wiring substrate MPS, each of the gate resin parts MRg is formed over a metal gate pattern GTp (see FIG. 5) exposed from the insulating film SR1. By forming the gate resin part MRg over the metal member in this way, in a gate breaking step to be conducted after this step, it becomes easier to separate the gate resin part MRg from the main body MRm of the sealing body MR.

In the example shown in FIG. 14, the gate part GT (see FIG. 15) is arranged on the side of the side MPs1 of the wiring substrate MPS. That is, in the sealing step of the present embodiment, a resin is supplied from the side of the side MPs1. Moreover, in the example shown in FIG. 14, the vent part VT (see FIG. 15) is arranged on the side of the side MPs2 of the wiring substrate MPS. That is, in the sealing step of the present embodiment, gas and resin in the cavity MT1b (see FIG. 15) are discharged from the side of the side MPs2 opposed to the side MPs1.

Moreover, as in the present embodiment, when the sealing body MR (see FIG. 13) is formed by the transfer mold method, as shown in FIG. 16, in an outer edge portion of the main body MRm of the sealing body MR, a flash resin part MRf is formed. The flash resin part MRf is a resin burr which is formed when the resin MRp (see FIG. 15) having leaked around an interface between the metal mold face MT1a of the upper mold MT1 of the molding apparatus MT shown in FIG. 13 and the upper surface WSt of the wiring substrate MPS spreads toward the outer edge portion of the wiring substrate MPS.

Further, as in the main body MRm, the flash resin part mRf contains black pigments. Therefore, when the code MK3 is covered with the flash resin part MRf, in steps thereafter, it becomes impossible to read the code MK3.

As shown in FIG. 16, when the vent pattern VTp which is a trench pattern is formed in the wiring substrate MPS, by discharging excessive resin along the vent pattern VTp, the leak of the resin is suppressed in a region in which the vent pattern VTp is not formed. However, even if the vent pattern VTp is formed, it is difficult to completely prevent the resin from leaking and, as shown in FIG. 16, the flash resin part MRf is formed.

Therefore, according to the present embodiment, by forming a dam part DM between the marking region MKR in which the code MK3 is formed and the device regions DVP, the spread of the flash resin part MRf is interrupted. The dam part DM is a member for controlling the spreading direction of the flash resin part MRf in order to suppress the spread over the marking region MKR. The dam part DM is formed in advance before the sealing step. In the example shown in FIG. 13, the upper surface WSt side of the wiring substrate MPS is covered with the insulating film SR1. Then, there is formed the dam part DM which is a trench pattern formed by removing the insulating film SR1 and part of the metal layer ML1 in a lower layer of the insulating film SR1. The die bonding step and the wire bonding step shown in FIG. 4 are conducted in a state where the dam part DM has been formed.

According to the present embodiment, by forming the dam part DM which prevents the marking region MKR from being covered with resin as described above, it becomes possible to read the code MK3 after the sealing body MR has been formed.

In terms of suppressing the flash resin part MRf covering the marking region MRK shown in FIG. 16, a preferred mode in detail, other than the above, of the dam part DM will be explained after describing an outline of the manufacturing method of the semiconductor device.

In the present embodiment, a mode has been illustrated such that the wiring substrate MPS with the dam part DM formed therein in advance is prepared at the stage of the base material providing step. It serves the purpose, however, if the dam part DM has been formed at least before formation of the sealing body MR. For instance, when the insulating film SR1 etc. shown in FIG. 13 are removed by radiating laser to form the dam part DM, as compared with the case where the photolithography technique is used, it is relatively easy to form the dam part DM. In this case, it is also possible to form the dam part DM at a given timing before the sealing step shown in FIG. 4.

However, as in the present embodiment, in the die bonding step and the wire bonding step, when the code MK3 is read to register the historical data of the production processes, as in the present embodiment, it is preferable that the code MK3 has been formed in the base material providing step.

Moreover, in the example shown in FIG. 5, of the frame region FR, the width of the regions FR3 and FR4 (length in X-direction from the outer edge portion of the wiring substrate MPS to the device regions DVP) is greater than the width of the regions FR1 and FR2 (length in Y-direction from the outer edge portion of the wiring substrate MPS to the device regions DVP). However, even if the code MK3 is affixed to the region FR3 and the region FR4, there is a possibility that the code MK3 will be covered with the flash resin part MRf because of the reasons below.

That is, external sizes of the semiconductor devices vary according to the kinds of products. On the other hand, in order to improve productivity of the semiconductor device, it is preferable for one production equipment to produce as many kinds of products as possible. In terms of sharing production equipment, it is preferable that the plane size of the wiring substrate MPS being a multi-piece substrate is shared. Moreover, when the sealing body MR is formed by the MAP method according to the present embodiment, it is preferable that the plane size of the main body MRm of the sealing body MR is shared.

According to the plane size of each of the device regions DVP, the widths of the regions FR1, FR2, FR3, and FR4 vary. However, in regions where the code MK3 can be affixed, namely, in the sealing step, areas of the portions which are not covered with the cavity MT1b (see FIG. 15) do not vary. In the case where the number of products to be obtained from one wiring substrate MPS is increased and, at the same time, the plane size of the wiring substrate MPS is shared by various kinds of products, it is preferable that the area not covered with the cavity MT1b is small. Consequently, the area of the region where the code MK3 can be affixed becomes small.

Moreover, of the frame region FR shown in FIG. 14, the region FR1 in which the gate pattern GTp (see FIG. 5) is formed needs a distance around the main body MRm of the sealing body MR to stabilize pressure for supplying the resin. Also, of the frame region FR, the region FR2 in which the vent pattern VTp is formed needs a distance around the main body MRm for adjusting a static pressure in the sealing step. On the other hand, of the frame region FR, in the regions FR3 and region FR4 arranged along the short sides, the gate pattern GTp and the vent pattern VTp are not formed. Therefore, if the upper surface WSt of the wiring substrate MPS can be held down by the metal mold face MT1a shown in FIG. 15, it is not necessary to secure a long distance around the main body MRm.

For this reason, in the example shown in FIG. 14, in the region FR3 and the region FR4, a distance from the outer edge portion (side MPs3 or side MPs4) of the wiring substrate MPS to the main body MRm of the sealing body MR is shorter than a distance from the outer edge portion (side MPs2) of the wiring substrate MPS in the region FR2 to the main body Rm.

Also, according to the present embodiment, as shown in FIG. 16, a length of the short side (side along Y-direction in FIG. 16) of the rectangular code MK3 in a plan view is, in the regions FR3 and FR4 shown in FIG. 14, longer than the distance from the outer edge portion (side MPs3 or side MPs4) of the wiring substrate MPS to the main body MRm of the sealing body MR. For this reason, the code MK3 cannot be arranged either in the region FR3 or in the region FR4, and is preferably arranged in the region FR2.

Moreover, in the example shown in FIG. 16, the code MK3 is formed astride the dicing region DCP in a plan view. When the code MK3 is arranged astride the dicing region DCP, in a division-into-pieces step to be described later, the code MK3 is cut, making it impossible to read the code MK3 afterwards. However, at the stage of the division-into-pieces step, since the mark MK1 and the code MK2 shown in FIG. 1 are affixed to the sealing body MR, it is possible to identify the historical data of production of each product even if the code MK3 is cut. Moreover, when the code MK3 is arranged astride the dicing region DCP, an area of the marking region MKR can be increased, thereby increasing the amount of information of the code MK3.

Figure 17:
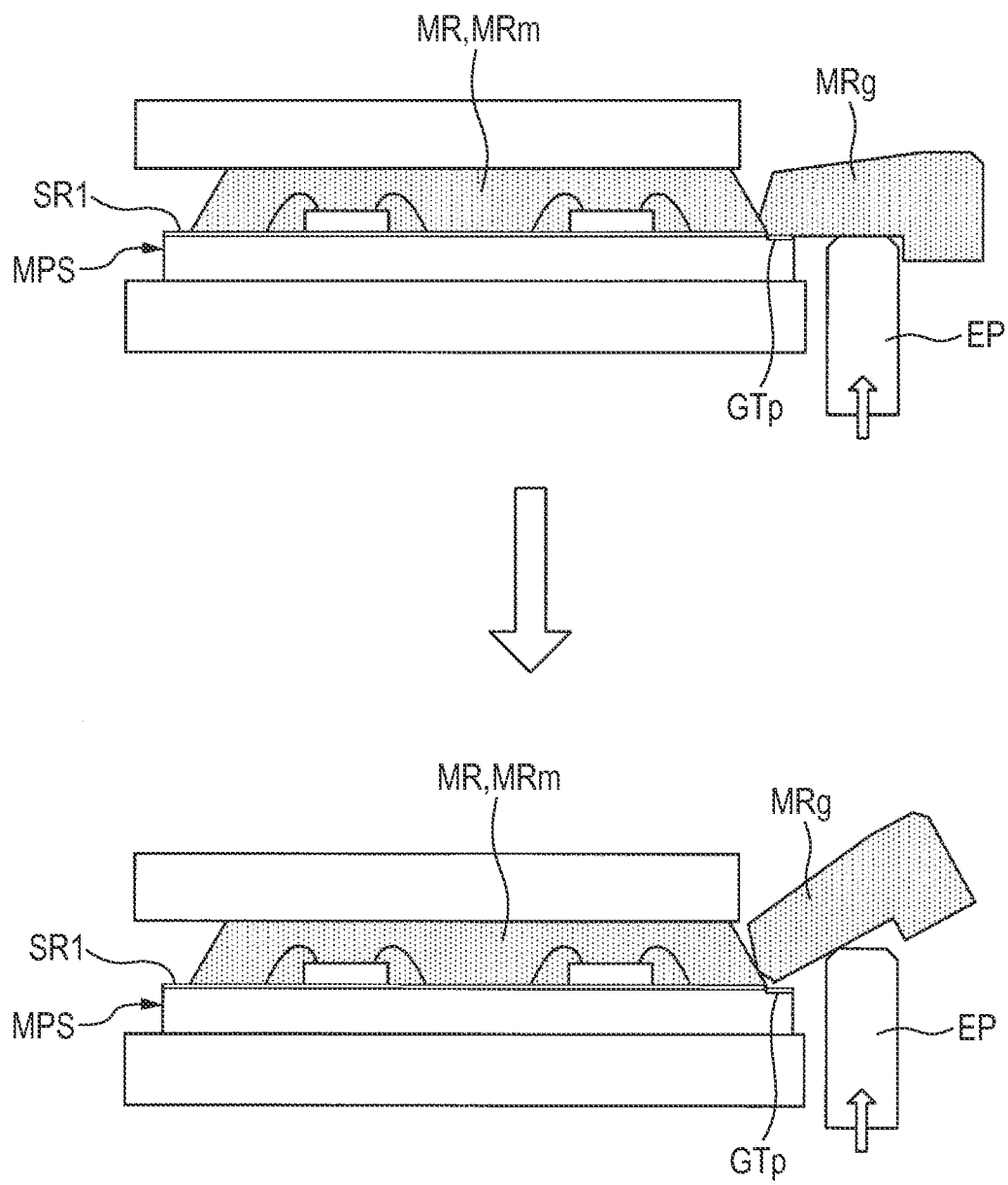
FIG. 17 is an explanatory view schematically showing a gate breaking step for separating a main body of the sealing body shown in FIG. 14 from a gate resin part.

Next, in a gate breaking step, the main body MRm of the sealing body MR and the gate resin part MRg shown in FIG. 14 are separated from each other. FIG. 17 is an explanatory view schematically showing the gate breaking step for separating the main body of the sealing body from the gate resin part shown in FIG. 14. In the gate breaking step, as schematically shown in FIG. 17, with the wiring substrate MPS and the main body MRm of the sealing body MR being fixed, a lower surface side of the gate resin part MRg is pressed up by a pressing jig EP such as a lift-up pin. As a result, with a boundary portion between the main body MRm and the gate resin part MRg, namely, a portion formed according to the shape of the gate part GT shown in FIG. 15 being a point of origin, the sealing body MR is collapsed, and the main body MRm and the gate resin part MRg are separated from each other.

At this time, in a position where the gate resin part MRg is formed, by forming a gate pattern GTp which is a metal pattern exposed from the insulating film SR1 and bringing the gate pattern GTp into close contact with the gate resin part MRg, it becomes possible to allow the gate resin part MRg to peel off the wiring substrate MPS more easily. Specifically, the more a contact area of the gate pattern GTp and the gate resin part MRg is increased, the more easily the gate resin part MRg can be peeled off the wiring substrate MPS in the gate breaking step. For this reason, in terms of suppressing the peeling off of the insulating film SR1 due to the contact between the gate resin part MRg and the insulating film SR1, it is preferable to increase the area of the gate pattern GTp. For instance, each plane area of the gate patterns GTp shown in FIG. 5 is larger than each plane area of the vent patterns VTp.

Moreover, as described above, in order to increase the number of products obtained from one wiring substrate MPS, it is preferable that the area of the frame region FR is smaller. Therefore, it is preferable to increase the plane area of the gate pattern GTp by increasing a width GTw of the gate pattern GTp in an extending direction (X-direction shown in FIG. 5) of the region FR2. That is, in an extending direction (X-direction in FIG. 5) of the long sides (side MPs1 and side MPs2) of the wiring substrate MPS shown in FIG. 5, each width GTw of the gate patterns GTp is greater than each width VTw of the vent patterns VTp.

In this way, when the plane area of the gate pattern GTp is increased, of the frame regions FR shown in FIG. 5, in the region FR1 arranged on the side of the supply port for the resin, it is difficult to secure space for forming the marking region MKR.

In the case of the region FR2, since it has a relatively large vacant space as compared with the region FR1, the area of the marking region MKR can be increased. Moreover, as shown in FIG. 16, in the region FR2, the marking region MKR is provided between the adjacent vent patterns VTp, and is arranged astride the dicing region DCP. Thus, when the marking region MKR is formed astride the dicing region DCP, the area of the marking region MKR can be increased. Further, by increasing the area of the marking region MKR, the amount of information which the code MK3 contains can be increased. Also, since an area of a unit pattern of graphic information of the code MK3 can be increased by increasing the area of the marking region MKR, it becomes possible to improve reading precision of the code MK3. Further, by increasing the area (total area) of the marking region MKR, it is possible to form the codes MK3 of the same kind over the wiring substrate MPS. Therefore, even if a certain code MK3 is damaged halfway through a task, the information of the wiring substrate MPS can be obtained by reading another code MK3.

Incidentally, when the spread of the flash resin part MRf shown in FIG. 16 is considered, the amount of resin leak around the side on the gate part GT side shown in FIG. 15 tends to be relatively small as compared with the amount of resin leak around other sides. However, as described above, when it is difficult to secure a space for providing the marking region MKR in the region FR1, the marking region MKR has to be provided in a region other than the region FR1.

Moreover, after the sealing step, there may be conducted a baking step (sealing-body heating and curing step) where the resin configuring the sealing body MR is further cured by heating the wiring substrate MPS in a baking furnace (not shown). In this case, the wiring substrate MPS can be taken out of the molding apparatus MT when, for instance, about 80 percent of the resin configuring the sealing body MR inside the molding apparatus MT shown in FIG. 13 is cured. Moreover, when the wiring substrates MPS are placed inside the heating furnace and cured, the wiring substrates MPS can be heated and cured collectively. As a result, working efficiency of the sealing step can be improved.

Though not shown, in the above die bonding step, as in the method explained with use of FIG. 10, the sealing step of the present embodiment includes, before or after the processes in the sealing step (for instance, sealing-body forming process, gate breaking process, and baking process), a step of reading the code MK3 formed over the wiring substrate MPS and storing thus read information (substrate ID) in the main server MS having a memory.

Therefore, according to the present embodiment, when completion of each process in the sealing step is confirmed, results of processing are stored in the main server MS through the control server CT1. For instance, it is recorded that a sealing body is formed with use of a resin MRp in the molding apparatus MT over the wiring substrate MPS having a substrate ID "K001." Moreover, there are recorded a device ID of a gate breaking device and working conditions when the gate resin part MRg formed over the wiring substrate MPS having the substrate ID "K001" is separated from the main body MRm. Moreover, there are recorded a device ID of the heating furnace and working conditions when the sealing body MR formed over the wiring substrate MPS having the substrate ID "K001" is heated and cured.

<Marking Step>

Figure 18:
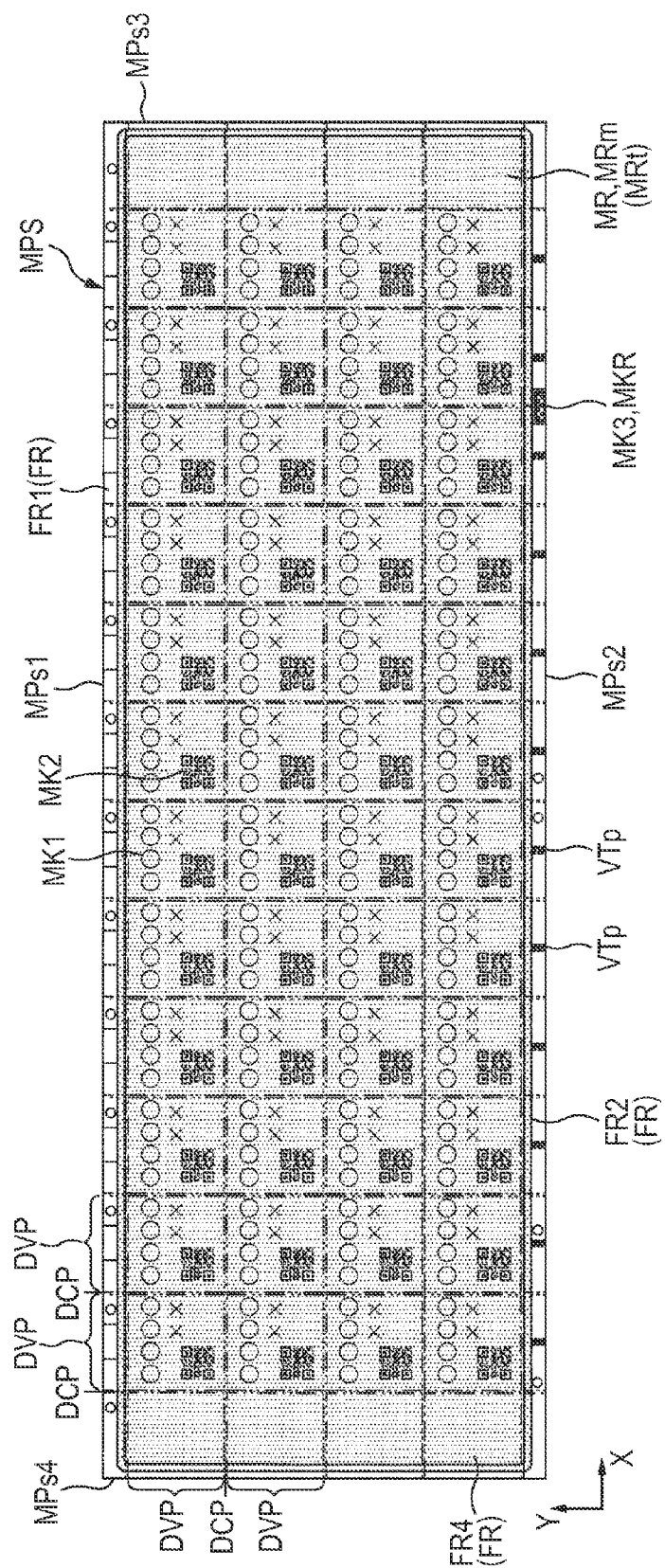
FIG. 18 is an enlarged plan view of a state where a gate resin part of the sealing body shown in FIG. 14 is removed and a mark and a code are formed over an upper surface of the sealing body.
Figure 19:
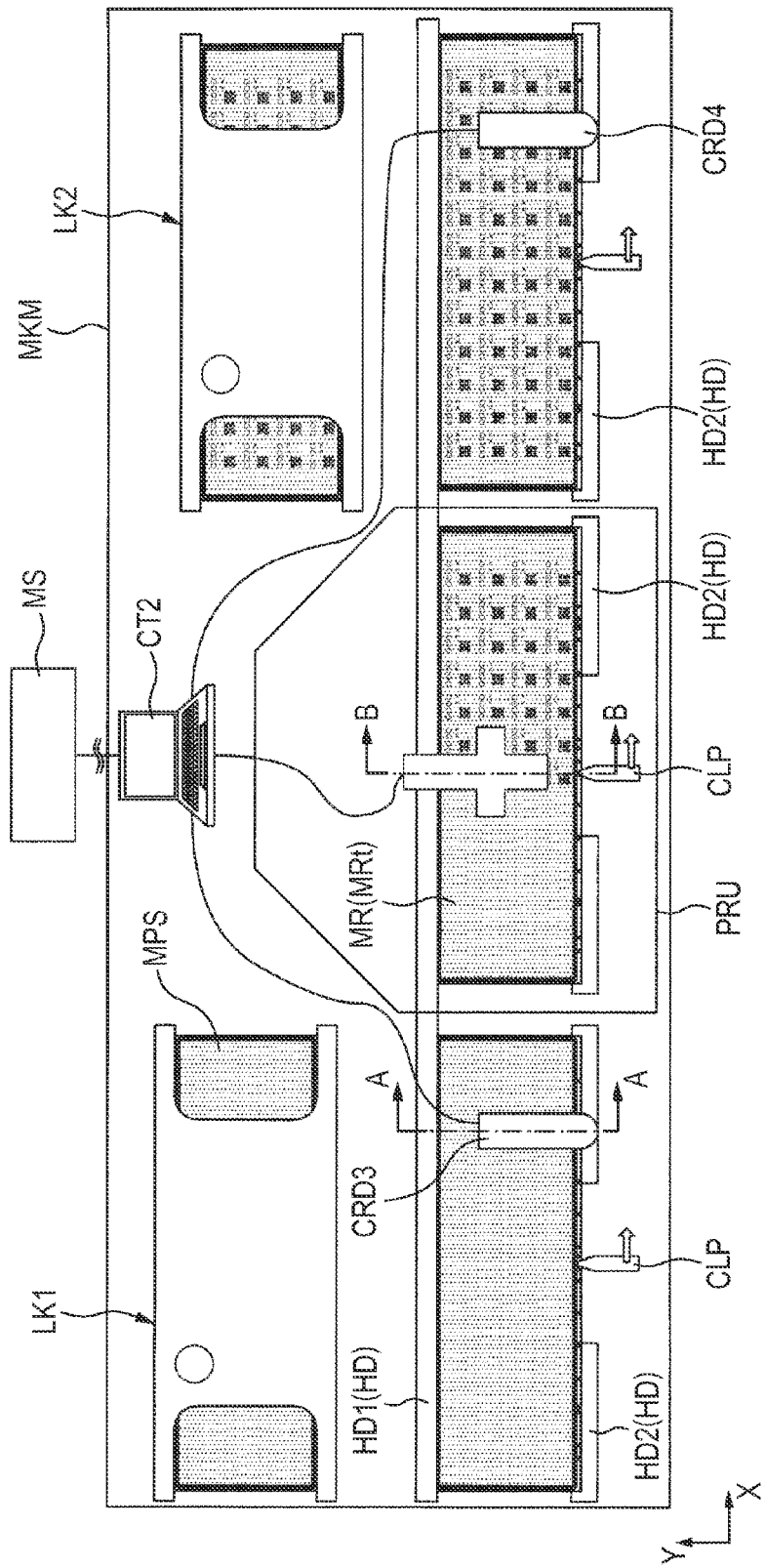
FIG. 19 is an explanatory view schematically showing a flow of a marking step shown in FIG. 4.
Figure 20:
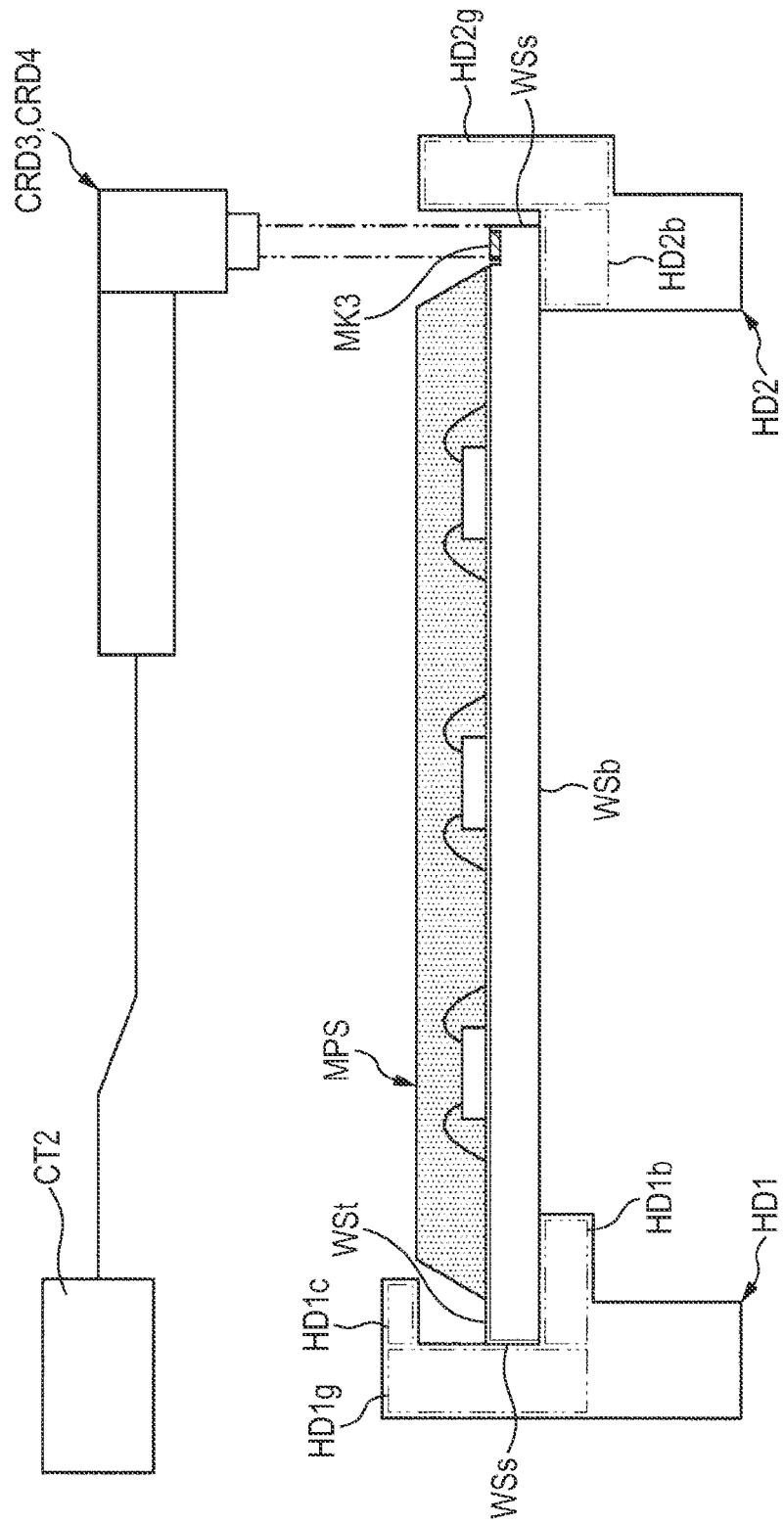
FIG. 20 is an explanatory view showing a step of reading a code of the wiring substrate in a cross-section taken along line A-A of FIG. 19.
Figure 21:
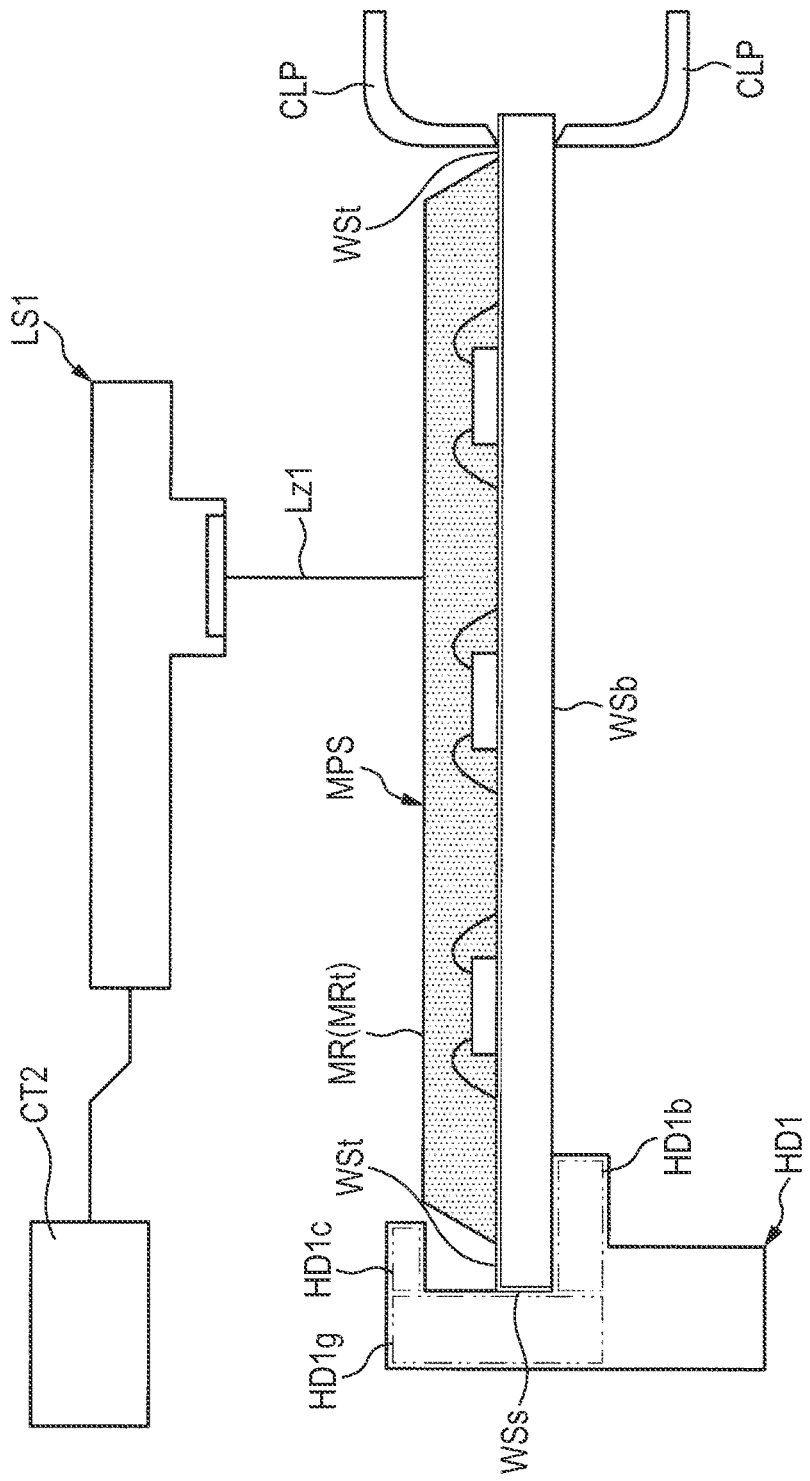
FIG. 21 is an explanatory view showing a step of forming the mark and the code over the upper surface of the sealing body in a cross-section taken along line B-B of FIG. 19.

Next, in a marking step shown in FIG. 4, as shown in FIG. 18, the mark MK1 and the code MK2 are formed over the upper surface MRt of the sealing body MR. FIG. 18 is an enlarged plan view showing a state where the mark and the code are formed over the upper surface of the sealing body after the gate resin part of the sealing body shown in FIG. 14 has been removed. Also, FIG. 19 is an explanatory view schematically showing a flow of the marking step shown in FIG. 4. Further, FIG. 20 is an explanatory view showing a step of reading a code of the wiring substrate in a cross-section taken along line A-A of FIG. 19. Still further, FIG. 21 is an explanatory view showing a step of forming the mark and the code over the upper surface of the sealing body in a cross-section taken along line B-B of FIG. 19.

As shown in FIG. 18, in this step, over the upper surface MRt of the sealing body MR, the mark MK1 being character information and the code MK2 being graphic information are formed, respectively. Moreover, the present embodiment includes a step of reading the code MK3 of the wiring substrate MPS before or after the formation of the mark MK1 and the code MK2 in the marking step.

Of the symbols affixed to the sealing body MR, the mark MK1 is a character symbol where, for instance, information such as a product model name is written using characters. Therefore, the same mark MK1 is affixed to each of the device regions DVP. Moreover, of the symbols affixed to the sealing body MR, the code MK2 is a graphic symbol where, for instance, information such as a product ID is encrypted. For this reason, each of the device regions DVP is provided with a different unique graphic symbol as the code MK2.

According to the present embodiment, the information of the code MK2 is registered such that it is correlated to information (information about historical data of production corresponding to the location) for each device region DVP of the wiring substrate MPS stored in the main server MS. As a result, by making reference to the main server MS for the registered information, it becomes possible to trace historical data of production of each product. In order to correlate the information of the wiring substrate MPS with the information of the code MK2, this step includes a step of reading the code MK3 of the wiring substrate MPS.

Now, referring to FIG. 19, a description will be made as to one mode of the marking step of the present embodiment which includes a step of reading the code MK3 and a step of forming the mark MK1 and the code MK2.

As shown in FIG. 19, there is installed (arranged) a code reader CRD3 in a loading part (between the loading part and the processing unit PRU, on a conveyance route from the loading part to the processing unit PRU) of the marking device MKM affixing the mark MK1 (see FIG. 18) and the code MK2 onto the sealing body MR in the marking step of the present embodiment. Moreover, a code reader CRD4 is installed (arranged) in an unloading part (between the processing unit PRU and the unloading part, on a conveyance route from the processing part PRU to the unloading part) of the die bonding device DBM.

The code readers CRD3 and CRD4 are ID readers which read two-dimensional codes affixed to the wiring substrate MPS and are coupled to the server (control server CT2) which controls the marking step. Moreover, as described with reference to FIG. 10, the control server CT2 is coupled to the main server MS in which information about historical data of production related to the mark MK3 of the wiring substrate MPS is stored.

In the marking step, in the loading part of the marking device MKM, there is set a rack LK1 being a conveyance jig which can convey the wiring substrates MPS in a received (stacked) state. Then, the wiring substrates MPS are taken out one by one from the rack LK1, and are arranged over a holder (guide rail) HD which is a holding jig for aligning the wiring substrates MPS during the reading and marking. The method of taking the wiring substrates MPS out of the rack LK1 one by one and transferring them to the holder HD is not particularly limited. For instance, after sliding the wiring substrates MPS stacked over the rack LK1, for instance, they can be transferred with use of an adsorption-type conveyance jig such as a conveyance jig DLV1 shown in FIG. 10.

As shown in FIG. 20, the holder HD includes: a rail (holding jig) HD1 for holding one long side of the wiring substrate MPS; and a rail (holding jig) HD2 for holding the other long side of the wiring substrate MPS.

Moreover, the rail HD1 includes: a support (portion) HD1b for supporting a lower surface WSb of the wiring substrate MPS; a guide (portion) HD1g arranged along a side surface WSs of the wiring substrate MPS; and an eaves (portion) HD1c for covering part of an upper surface WSt of the wiring substrate MPS. Moreover, the guide HD1g of the rail HD1 is joined to the support HD1b and the eaves HD1c.

On the other hand, the rail HD2 includes: a support (portion) HD2b which supports the lower surface WSb of the wiring substrate MPS; and a guide (portion) HD2g arranged along the side surface WSs of the wiring substrate MPS. Moreover, the guide HD2g of the rail HD2 is joined to the support HD2b. However, in the case of the rail HD2, there is not formed a portion, like the eaves HD1c of the rail HD1, for covering part of the upper surface WSt of the wiring substrate MPS. Thus, since the rail HD2 is not provided with the eaves HD1c, as shown in FIG. 20, by arranging the wiring substrate MPS so that the code MK3 will be located on the rail HD2 side, the code MK3 formed on the upper surface WSt side of the wiring substrate MPS can be recognized visually.

After arranging the wiring substrate MPS in the holder HD, the code MK3 affixed to the wiring substrate MPS is read (code reading step) using the code reader CRD3 shown in FIGS. 19 and 20. The code reader CRD3 has an image sensor such as a camera and obtains a pattern of a graphic symbol of the code MK3 as an image. Further, the code reader CRD3 decodes encrypted information, namely, unique information (substrate ID) of the wiring substrate MPS according to the obtained pattern.

In this code reading step, as shown in FIG. 20, the code MK3 is read in a state where the lower surface WSb of the wiring substrate MPS is supported by the support HD1b of the rail HD1 and the support HD2b of the rail HD2 and, at the same time, part of the upper surface WSt of the wiring substrate MPS is covered with the eaves HD1c of the rail HD1. At this time, as described above, the rail HD2 is not provided with the eaves HD1c. Therefore, if the code MK3 is affixed to a portion supported by the rail HD2, the code MK3 can be recognized visually. Moreover, as described above, according to the present embodiment, by forming the dam part DM shown in FIG. 16, the code MK3 being covered with the flash resin part MRf can be suppressed. For this reason, if the code reader CRD3 is arranged above the holder HD2b of the rail HD2, the code reader CRD3 can obtain an image of the code MK3.

The unique information (substrate ID) of the wiring substrate MPS decoded based on the image obtained by the code reader CRD3 is transferred to the control server CT1. Thus, by reading the code MK3 before affixing a code MK2 (see FIG. 18) onto the sealing body MR, the code MK2 can be generated based on information of the code MK3. For instance, as explained in the die bonding step, when the wiring substrate MPS has a defective device region DVP (see FIG. 18) and information about the defective device region DVP is stored in the main server MS, it is possible to specify the defective device region DVP before generating the code MK2. In this case, it is possible not to form the code MK2 with respect to the defective device region DVP. Alternatively, the code MK2 can be generated by encrypting information that the device region DVP is defective.

There can be made correlation between historical data of production of each device region DVP shown in FIG. 18 and the code MK2, for instance, by the control server CT2 shown in FIG. 19. Therefore, as a modification of the present embodiment, it is possible to generate the codes MK2 before reading the code MK3 of the wiring substrate MPS. However, as described above, in terms of allowing the defective device region DVP to be easily identified, it is preferable to generate, after having read the code MK3, the codes MK2 based on information of the code MK3.

Next, the wiring substrate MPS whose code MK3 is read is transferred to the processing unit PRU along the rail HD1 of the holder HD shown in FIG. 19 and, in the processing unit PRU, the mark MK1 (see FIG. 18) and the code MK2 (see FIG. 18) are formed (Mark forming step).

In the example shown in FIG. 19, the marking device MKM has a conveyance jig (clip arm) CLP which conveys the wiring substrate MPS while clamping the wiring substrate MPS held in the holder HD in an extending direction (X-direction in FIG. 19) of the rail HD1. As shown in FIG. 19, the rail HD2 is divided into a plurality of portions in the extending direction of the rail HD1, and the conveyance jig CLP is inserted between the divided rails HD2. As shown in FIG. 21, the conveyance jig CLP includes a portion which presses the upper surface WSt side of the wiring substrate MPS and a portion which presses the lower surface WSb side so that the conveyance jig CLP can hold and fix the wiring substrate MPS therebetween in a thickness direction. Moreover, as schematically shown by an arrow in FIG. 19, the conveyance jig CLP is movable along the extending direction of the rail HD1. Therefore, the wiring substrate MPS moves along the extending direction of the rail HD1 being held in the conveyance jig CLP.

Moreover, in the example shown in FIG. 19, a laser radiating device LS1 is provided in the processing unit PRU of the marking device MKM. According to the present embodiment, as shown in FIG. 21, the marks MK1 and the codes MK2 shown in FIG. 18 are formed by radiating a laser beam Lz1 to the upper surface MRt of the sealing body MR from the laser radiating device LS1 which is a light source. Specifically, when the laser beam Lz1 is radiated to the upper surface MRt of the sealing body MR, part of the upper surface MRt of the sealing body MR is removed. As a result, in the upper surface MRt of the sealing body MR, the mark MK1 (see FIG. 18) and the code MK2 (see FIG. 18) which are concave and convex faces are engraved, respectively.

At this time, as described above, if there is a defective device region DVP (see FIG. 18) in the wiring substrate MPS, the mark MK1 and the code MK2 may not be formed in the device region DVP concerned. In this case, since the time for laser radiation is shortened, necessary energy can be reduced. Moreover, by shortening the processing time, productivity can be raised.

When completion of the marking process of the mark MK1 and the code MK2 is confirmed in one device region DVP shown in FIG. 18, the result is stored in the main server MS (see FIG. 19) through the control server CT2. At this point, historical data of production in the marking process shown in FIG. 18 and the code MK2 being unique identification information (product ID) of each product are tied with each other. For instance, it is recorded that a product having a product ID "DV001" produced at a location "X01Y01" in the wiring substrate MPS whose substrate ID K001" is marked based on a marking method (RMK001) by the marking device MKM.

In addition, in the example shown in FIG. 19, a step of reading the code MK3 using the code readers CRD3 and CRD4 and a step of affixing the code onto the sealing body MR are conducted at different locations. In such a case, processing can be applied successively to the wiring substrates MPS. However, as a modification, the mark MK3 may be read in the processing unit PRU. In this case, one of the code readers CRD3 and CRD4 may be used.

After that, in the same wiring substrate MPS, when it is determined that the additional mark MK1 and code MK2 can be formed, the process is advanced to a next process target position in the wiring substrate MPS and the marking is repeated.

On the other hand, when it is determined that all the processing (in this case, the marking) to the same wiring substrate MPS is over, a first wiring substrate MPS having gone through the marking is conveyed to the unloading part from the processing unit PRU of the marking device MKM.

Subsequently, as shown in FIG. 19, the code MK3 of the wiring substrate MPS is read using the code reader CRD4 of the unloading part. Then, reference is made to the main server MS about the substrate ID through the control server CT2. Then, as a result of the reference, when it is confirmed that the substrate ID corresponds to the substrate Id read using the code reader CRD3 of the loading part, the control server CT2 permits the wiring substrate MPS to be received in a rack LK2.

Further, as a result of the above reference, when it is confirmed that the substrate ID does not correspond to the substrate ID read by the code reader CRD3 of the loading part, the state is determined to be abnormal and the process is discontinued. That is, the die bonding is stopped and contents of the error are displayed on a monitor.

The wiring substrate MPS having gone through the marking step is received in the rack LK2, and the result of receiving the wiring substrate MPS is stored in the main server MS through the control server CT2. After that, a check is made to see if the rack LK2 is full or not. When it is determined that the rack LK2 is not full, that is, the rack LK2 is capable of receiving some more wiring substrates MPS, the process of receiving into the rack LK2 is repeated until it is determined that the rack LK2 is full.

In addition, in the example shown in FIG. 19, identification information is not affixed to the rack LK2. However, as a modification, identification information may be affixed to the rack LK2. In such a case, historical data of production can be managed per rack LK2 unit by reading the code made by symbolizing the identification information affixed to the rack LK2 and storing it in the main server MS through the control server CT2.

Moreover, as a modification of the present embodiment, in the unloading part, the codes MK2 shown in FIG. 18 may be read using a code reader CRD4. In such a case, it is possible to make sure whether the codes MK2 are correctly formed or not in the marking step.

<Ball Mounting Step>

Next, in a ball mounting step shown in FIG. 4, over the lower surface WSb of the wiring substrate MPS, the solder balls (solder materials) SB (see FIG. 2) are bonded, respectively, to the lands LD (see FIG. 12) exposed from the insulating film SR2 (see FIG. 12). In this step, for instance, with the lower surface WSb of the wiring substrate MPS facing upward, the lands LD and the solder balls SB are bonded by arranging ball-like solder materials over the lands LD and applying heating treatment (reflow treatment).

<Division-into-Pieces Step>

Next, in a division-into-pieces step shown in FIG. 4, the wiring substrate MPS and the sealing body MR are cut along a dicing region DC shown in FIG. 18 and, in each of the device regions DVP, a semiconductor package is separated. As a cutting method, a blade dicing method can be employed. According to the blade dicing method, a disc with abrasive grains adhered to its edge is rotated and moved along the dicing region DCP. Also, the semiconductor package obtained in this step is a test body which is a subject to be tested in the testing step shown in FIG. 4.

<Testing Step>

Next, in a testing step shown in FIG. 4, necessary tests such as an appearance check and an electrical characteristic test are conducted, and non-defective products meeting evaluation criteria prepared in advance are picked up. Further, the non-defective product, namely, the semiconductor device PKG1 shown in FIG. 1 is shipped or mounted onto a packaging substrate (not shown). Also, defective products not meeting the evaluation criteria are properly repaired or done away with depending on contents of the defect.

<Details of Dam Part>

Figure 22:
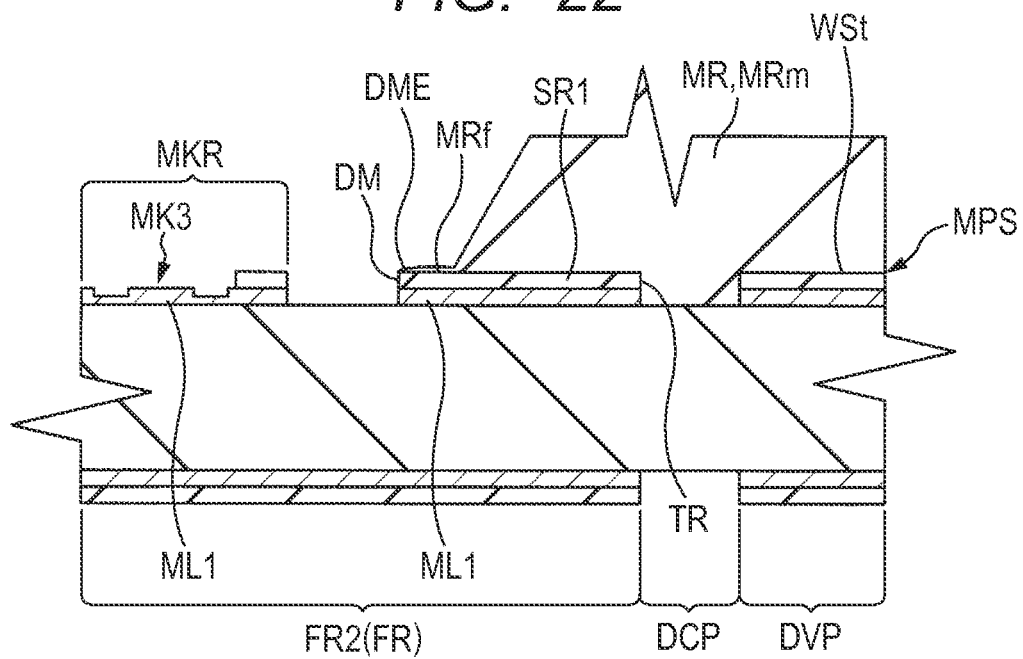
FIG. 22 is an enlarged sectional view taken along line A-A of FIG. 16.
Figure 23:
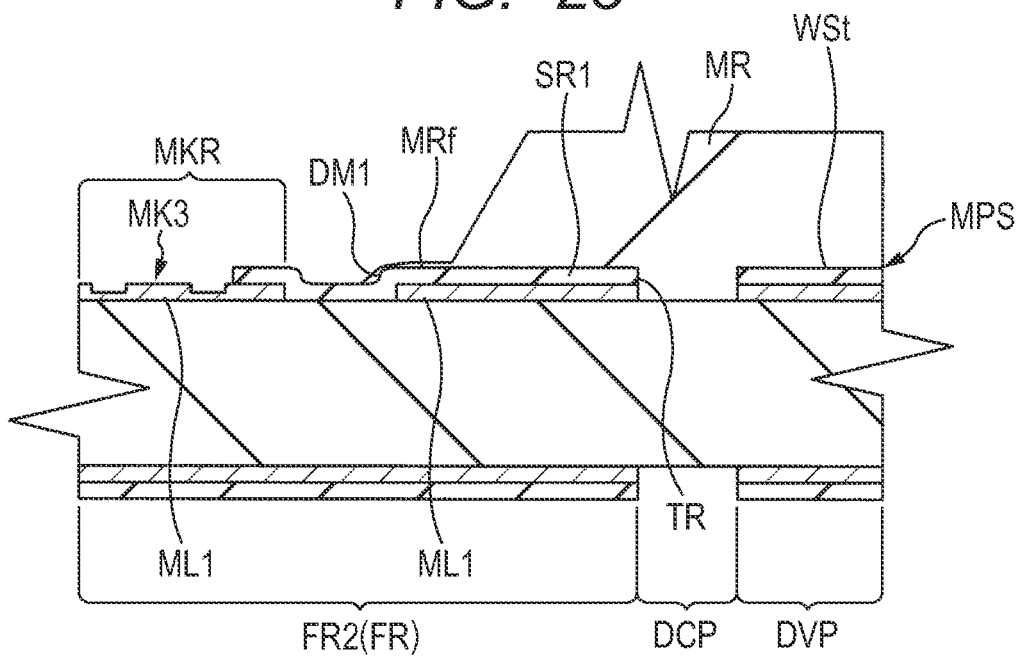
FIG. 23 is an enlarged sectional view showing a dam part which is a modification of the embodiment shown in FIG. 22.
Figure 24:
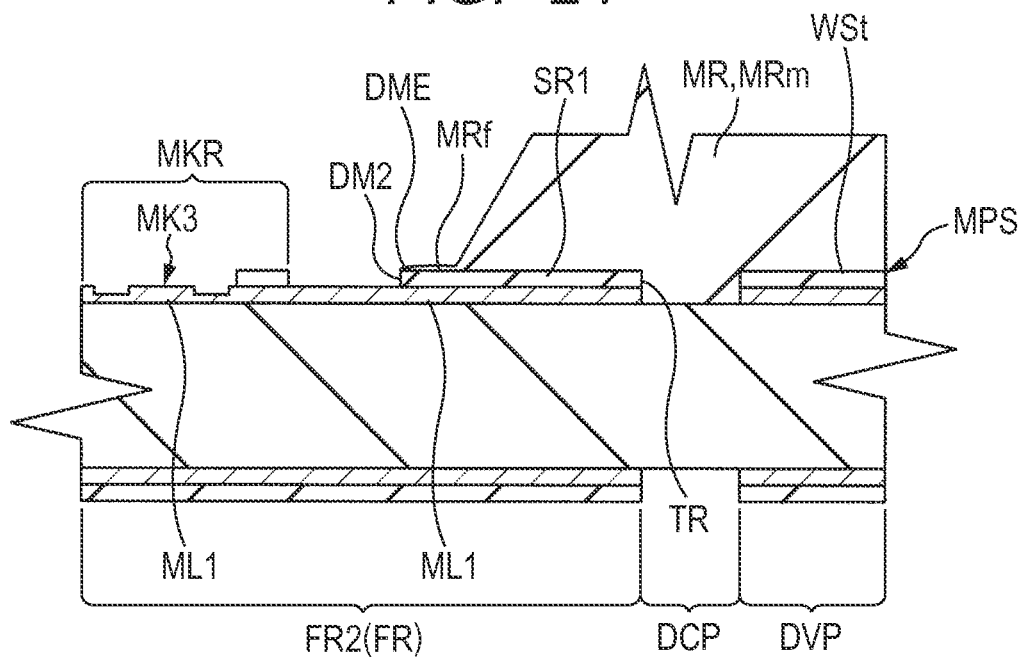
FIG. 24 is an enlarged sectional view showing the dam part which is another modification of the embodiment shown in FIG. 22.
Figure 25:
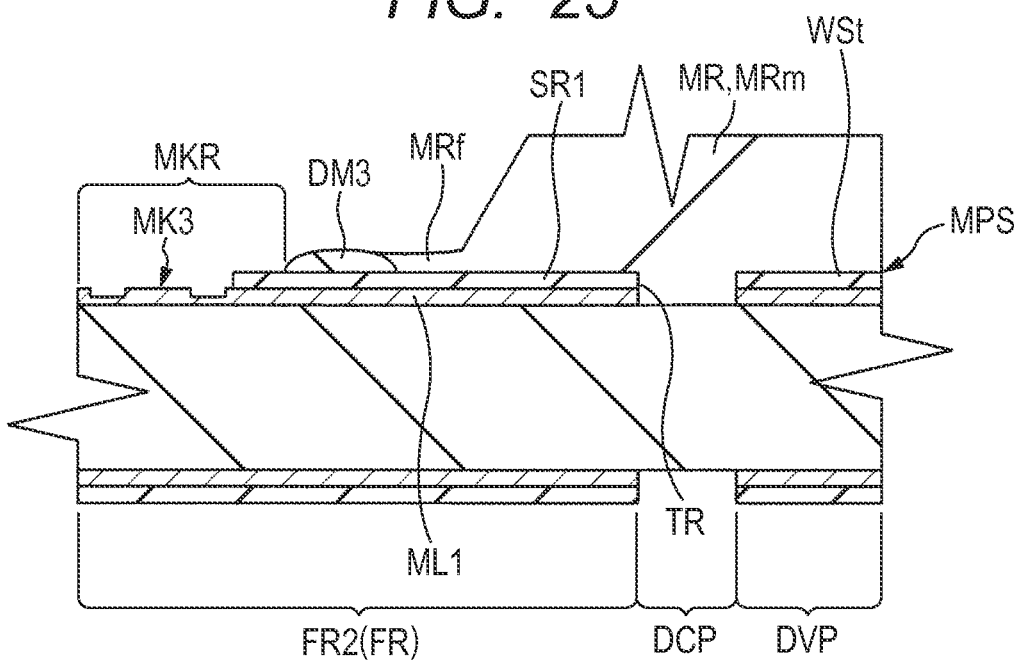
FIG. 25 is an enlarged cross-sectional view showing a dam part which is still another modification of the embodiment shown in FIG. 22.
Figure 26:
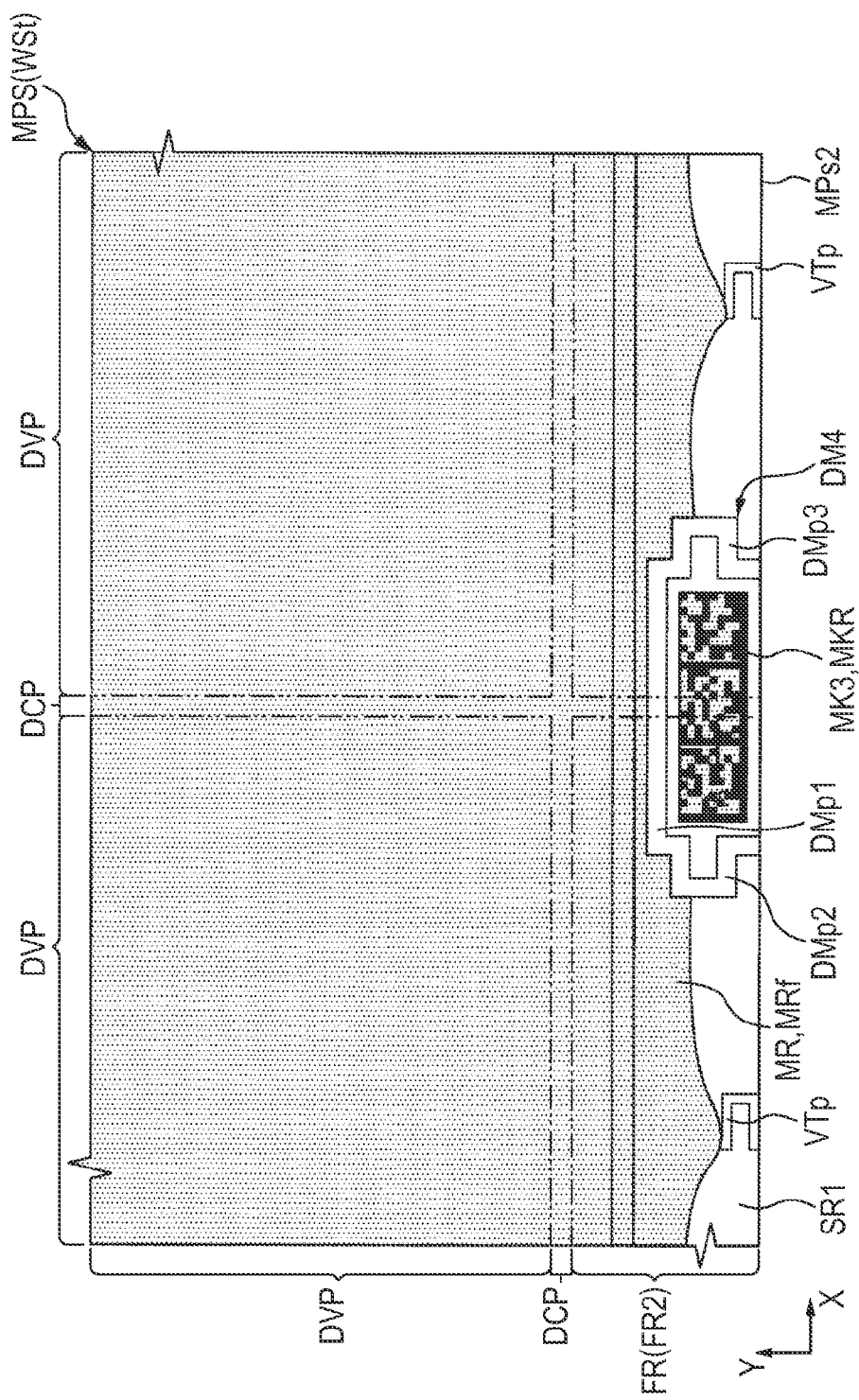
FIG. 26 is an enlarged cross-sectional view showing the dam part which is a modification of the embodiment in FIG. 16.

Next, with regard to the dam part DM explained in the sealing step, its detailed configuration will be described. Also, in this section, in addition to the configuration of the dam part shown in FIG. 16, a typical modification will be explained. FIG. 22 is an enlarged cross-sectional view taken along line A-A of FIG. 16. Further, FIGS. 23 to 25 are enlarged cross-sectional views showing a dam part which is a modification of the embodiment shown in FIG. 22. Still further, FIG. 26 is an enlarged plan view showing a dam part which is a modification of the embodiment shown in FIG. 16.

As shown in FIG. 16 and FIG. 22, the dam part DM is formed between the marking region MKR and the device region DVP, which can be described more specifically as follows. That is, the dam part DM is formed between the main body MRm of the sealing body MR and the marking region MKR.

For instance, as shown in FIG. 22, in the dicing region DCP between the device region DVP and the frame region FR, there may be a case where the insulating film SR1 and the metal pattern in the lower layer of the insulating film SR1 are removed and a trench pattern TR is formed along the dicing region DCP. However, as shown in FIG. 22, part of the main body MRm of the sealing body MR is formed on the outer side of the edge portion of the wiring substrate MPS than the trench pattern TR. Therefore, in order to interrupt the spread of the flash resin part MRf, in the present embodiment, there is formed a dam part DM different from the trench pattern TR formed in the dicing region DCP between the main body MRm of the sealing body MR and the marking region MKR. That is, the dam part DM shown in FIG. 16 is an interruption pattern for interrupting the flash resin part MRf spreading around the main body MRm of the sealing body MR. Also, for the similar reason, as shown in FIG. 13, in the sealing step, the dam part DM is not covered with the cavity MT1b.

Further, the dam part DM shown in FIG. 22 is a trench pattern formed by covering the upper surface WSt side of the wiring substrate MPS with the insulating film SR1 and removing part of the insulating film SR1 and the metal layer ML1 in the lower layer of the insulating film SR1. As methods for removing part of the insulating film SR1 and the metal layer ML1, there are a method of removing by etching using a photolithography technique and a method of removing by radiating a laser beam to a portion to be removed.

As in the dam part DM1 of the modification shown in FIG. 23, when the metal layer ML1 in the region for forming the dam part DM1 is removed in advance to form the trench pattern and the insulating film SR1 is so formed as to cover the trench pattern, in accordance with the shape of the metal layer ML1, the insulating film SR1 comes to be in the shape where the dam part DM1 is recessed.

When the dam part DM which is the trench pattern is formed, however, as shown in FIG. 22, the resin which configures the flash resin part MRf has a tendency to be dammed up by the surface tension at an edge portion (edge part DME shown in FIG. 22) of the trench pattern. The resin stopped by the surface tension changes its spreading direction and, as shown in FIG. 16, it spreads so as to surround the circumference of the dam part DM. This effect of surface tension becomes greater when the edge part DME whose extending direction of the surface sharply changes is formed at the edge of the trench pattern. Moreover, as an angle of the edge part DME gets acute, the effect of the surface tension becomes greater.

On the other hand, as in the dam part DM1 shown in FIG. 23, when the edge portion of the trench pattern is formed in accordance with the pattern of the metal layer ML1 in the lower layer, the edge part DME shown in FIG. 22 is hard to be formed, and the edge portion of the dam part DM becomes an end surface. In this case, as shown in FIG. 23, it becomes easier for the resin forming the flash resin part MRf to enter the trench pattern.

Therefore, in terms of making it easier to prevent the spread of the resin by the surface tension, as shown in FIG. 22, it is preferable to form the dam part DM in the method where the edge part DME of an acute angle is formed at the edge of the trench pattern. As described above, in the case of the trench pattern formed by the method using a photolithography technique or by removing at least part of the insulating film SR1 with use of laser radiation, as in the dam part DM shown in FIG. 22, the edge part DME can be formed more easily.

As to the dam part DM, if at least part of the insulating film SR1 on the side of the upper surface WSt is removed, it is not necessary to remove the metal layer ML1. Therefore, for instance, as in the dam part DM2 shown in FIG. 24, even in the case of the trench pattern where the insulating film SR1 is removed and the metal layer ML1 is not removed, when the resin can be dammed up by the edge part DME, the same effect as in the case of the dam part DM shown in FIG. 22 can be obtained.

However, as shown in FIG. 22, when the dam part DM is formed by removing both the insulating film SR1 and the metal layer ML1, a trench depth of the dam part DM can be deepened. In this case, even if a resin enters inside the trench pattern, the resin entering the marking region MKR while advancing beyond the trench pattern can be suppressed.

In FIGS. 22 to 24, the method has been explained as to controlling the spreading direction of the resin by the dam parts DM, DM1, and DM2 which are trench patterns. However, as in the dam part DM3 shown in FIG. 25, a protruding member which protrudes in the upper surface WSt direction of the wiring substrate MPS may be provided between the marking region MKR and the main body MRm of the sealing body MR.

As in the case of the dam part DM3, when the dam part DM3 containing the protruding member is formed, it becomes easy for the dam part DM to come into close contact with the mold face MT1a of the molding apparatus MT shown in FIG. 13. Therefore, although the resin which configures the flash resin part MRf easily spreads as far as the vicinity of the top of the dam part DM3, the spread of the resin advancing beyond the dam part DM3 can be suppressed. Moreover, in the case of the dam part DM3 containing the protruding member, the spread of the resin is suppressed by bringing the molding apparatus MT of FIG. 13 into close contact with the dam part DM3. Therefore, as compared with the dam parts DM, DM1, and DM2 shown in FIGS. 22 to 24, the effect of damming up the resin is greater.

The dam part DM3 can be formed over the insulating film SR1 by using a mask (not shown), for instance, after the formation of the insulating film SR1. Alternatively, the dam part DM3 can be molded in advance and can be bonded to the insulating film SR1 through an adhesive. Alternatively, as a modification of the embodiment in FIG. 25, in a region where the dam part DM3 over the metal layer ML1 is to be formed, after the formation of the protruding member (not shown), the dam part DM3 containing the insulating film SR1 can be formed by so forming insulating film SR1 as to cover the protruding member.

A planar shape of the dam part DM3 is not shown since it is the same as that of the dam part DM in FIG. 16. However, as in the dam part DM shown in FIG. 16, when the dam part DM3 shown in FIG. 25 is selectively formed so as to surround the circumference of the marking region MKR, the resin is likely to leak in the peripheral region of the dam part and the flash resin part MRf can spread widely. Therefore, in terms of reducing the amount of the flash resin part MRf formed in one wiring substrate MPS, as shown in FIGS. 22 to 24, the dam parts DM, DM1, and DM2 containing trench patterns are more preferable.

Next, the planar shape of the dam part DM shown in FIG. 16 will be described. As shown in FIG. 16, in the region FR2 of the frame region FR, the dam part DM is selectively formed so as to surround the circumference of the marking region MKR. However, an outer edge portion of the marking region MKR is in contact with the side MPs2 of the wiring substrate MPS, and the dam part DM is not formed on the side of the side MPs2. In other words, the marking region MKR is surrounded by the side MPs2 which configures the edge portion of the wiring substrate MPS and the dam part DM.

Further, the dam part DM includes: a portion (long side portion) DMp1 extending along an extending direction (X-direction in FIG. 16) of the side MPs2; a portion (first short side portion) DMp2 extending along a direction (Y-direction in FIG. 16) orthogonal to the extending direction of the side MPs2; and a portion (second short side portion) DMp3 extending, being opposed to the portion DMp2, along Y-direction. Moreover, each one end of the portions DMp2 and DMp3 is joined to the portion DMp1, and the other end extends to the side MPs2 of the wiring substrate MPS. That is, the marking region MKR is continuously surrounded by the side MPs2 which configures the outer edge portion of the wiring substrate MPS and the dam part DM.

Although not shown, as a modification of the embodiment shown in FIG. 16, a mode of either or both of the portions DMp2 and DMp3 of the dam part DM not reaching the side MPs2 of the wiring substrate MPS is conceivable. However, as shown in FIG. 16, by continuously surrounding the marking region MKR with the dam part DM and the side MPs2, it is possible to prevent the resin, whose spreading direction is altered by the dam part DM, from making a detour and entering the marking region MKR.

Also, in the example shown in FIG. 16, the portions DMp1, DMp2, and DMp3 of the dam part DM are formed in a rectilinear manner, respectively. In this way, when the portions DMp1, DMp2, and DMp3 are formed in the rectilinear manner, respectively, it is easier to form the trench pattern.

The planar configurations of the portions DMp1, DMp2, and DMp3 of the dam part DM include various modifications other than the rectilinear forms shown in FIG. 16. For instance, a the dam part DM4 shown in FIG. 26, the portions DMp2 and DMp3 extend in a meandering manner from respective joints with the portion DMp1 toward the side MPs4 along Y-direction. In the case of the dam part DM4, a route distance of the resin which configures the flash resin part MRf spreading and reaching the side MPs2 of the wiring substrate MPS becomes longer than the dam part DM shown in FIG. 16. For this reason, a side face of the wiring substrate MPS becomes less likely to get dirty with the resin.

<Other Modifications>

The invention made by the present inventors was described specifically based on some embodiments. The invention is however not limited to or by them but can be changed in various ways without departing from the scope of the invention.

<Modification 1>

For instance, in the embodiment described above, as one mode of the graphic symbol in which information about the substrate ID is encrypted, the explanation was made using the code MK3 of FIG. 16 by way of example. However, there are various modifications for the graphic symbol to which above technique can be applied. For instance, like the code MK2 shown in FIG. 1, a two-dimensional code which has a finder pattern may be used for the code MK3 shown in FIG. 16.

Moreover, for instance, when a one-dimensional code not having information in Y-direction is affixed to the marking region MKR shown in FIG. 16, as compared with the code MK3 which is a two-dimensional code, the amount of information is reduced. In spite of that, even when part of the one-dimensional code is covered with a resin, the capability of reading is improved. However, as described above, in terms of increasing the number of products that can be obtained from one wiring substrate MPS, it is preferable to affix the two-dimensional code which has a large amount of information per unit area.

<Modification 2>

Also, for instance, in the above embodiment, in the sealing step, the explanation was made as to the case where the marking region MKR is provided in the region FR2 (see FIG. 14) along the side MPs2 (see FIG. 14) where the vent part VT (see FIG. 14) of the molding apparatus MT (see FIG. 15) is arranged. However, as a modification, of the frame region FR shown in FIG. 14, if the marking region MKR can be arranged in one of the regions FR1, FR3, or FR4, the marking region MKR may be provided in the regions FR1, FR3, or FR4.

As described in the above embodiment, when the sealing body MR (see FIG. 14) is formed by the transfer mold method using the molding apparatus MT (see FIG. 15), the resin which configures the flash resin part MRf shown in FIG. 16 spreads easily along the vent part VT (see FIG. 15). Therefore, in the sealing step, if the marking region MKR is arranged in the regions FR1, FR3, or FR4 where the vent part VT is not arranged, it becomes easy to suppress the resin entering the marking region MKR.

However, as described above, in terms of increasing the number of products obtained from one wiring substrate MPS, it is preferable that, in the regions FR3 and FR4, a distance between the edge portion of the wiring substrate MPS and the main body MRm of the sealing body MR is shorter. Moreover, since the gate pattern GTp (see FIG. 5) is arranged in the region FR1, a vacant space thereof is smaller as compared with the region FR2. Also, in the sealing step according to the transfer mold method, at the side where the vent part VT is not arranged, as compared with the side where the vent part VT is arranged, the resin is less likely to spread. However, even in the case of the side where the vent part VT is not arranged, the resin may leak depending on the conditions of fluidity and supply pressure of the resin or a condition of the close contact between the molding apparatus and the wiring substrate MPS. Therefore, even if the marking region MKR is arranged in the regions FR1, FR3, or FR4, it is preferable to provide the dam part DM shown in FIGS. 16 and 22 or the dam part of each modification described above between the marking region MKR and the main body MRm of the sealing body MR and to control the direction in which the flash part MRf spreads.

<Modification 3>

Also, for instance, in the above embodiment, as an example of the semiconductor device, the explanation was made using a BGA type semiconductor device PKG1 having the wiring substrate WS in which there are formed the insulating layer, the wirings formed in the insulating layer, and the terminals formed in the insulating layer. However, various modifications are available for the packaging mode of the semiconductor device. For instance, as the base material to be provided in the base material providing step described in the above embodiment, in place of the wiring substrate, metal base materials such as a lead frame can be used.

When using metal parts such as the lead frame for the base material, as compared with the wiring substrate MPS, higher degree of flatness of the base material can be obtained. Also, the metal base material such as the lead frame is less likely to have disconnection of wirings etc. even when pressed down with a strong force. Therefore, in the sealing step, it is possible to improve the pressing force (clamp force) when clamping the base material with use of the molding apparatus MT (see FIG. 15). For this reason, when the metal base material is used, in the sealing step, the close contact between the mold face MT1a shown in FIG. 15 and the base material can be improved, thereby suppressing the resin leakage in the sealing step.

Also, like in the above embodiment, as a modification of the semiconductor device using the wiring substrate MPS as the base material, there is known a semiconductor device of an LGA (Land Grid Array) type where the solder balls SB shown in FIG. 2 are not coupled and the lands are exposed (or a solder film is formed over an exposed surface of the lands LD). In so-called area array type semiconductor devices such as the BGA and the LGA where external terminals are arranged in a matrix shape over a packaging surface of the wiring substrate WS, the packaging surface of the semiconductor device can be effectively used as an arrangement space for the terminals. Therefore, as compared with the QFP (Quad Flat Package) and the QFN (Quad Flat Non-leaded Package) which are manufactured using lead frames, the number of terminals per unit area can be increased.

<Modification 4>

Also, for instance, in the above embodiment, the explanation was made as to the mode where the wire BW was used as the conductive member for electrically coupling the semiconductor chip CP with the wiring substrate WS. However, there are various modifications as the method for electrically coupling the semiconductor chip CP with the wiring substrate WS. For instance, in a state where the surface CPt of the semiconductor chip CP shown in FIG. 2 is opposed to the upper surface WSt of the wiring substrate WS, the semiconductor chip CP can be mounted over the wiring substrate WS with use of a so-called flip-chip bonding method. In this case, the semiconductor chip CP is electrically coupled with the wiring substrate WS via a plurality of projection electrodes (not shown) coupled to the pads PD of the semiconductor chip CP.

As has been described in the above embodiment, when electrically coupling the semiconductor chip CP with the wiring substrate WS using the wires BW, in the sealing step, when the supply pressure of the resin is raised, there may be caused a phenomenon, which is so-called "wire sweep", where a loop form of the wire BW is deformed due to the pressure of the resin. As described in the above embodiment, in the case where the diameter of the wire BW is small, the deformation particularly tends to occur. For this reason, in the sealing step, in order to reduce the supply pressure of the resin, there arises a need to raise the fluidity of the resin. As a result, in the sealing step, the resin tends to leak outside the cavity MT1b (see FIG. 15) of the molding apparatus MT and the flash resin part MRf shown in FIG. 16 tends to spread easily.

On the other hand, as in the above modification, when electrically coupling the semiconductor chip CP with the wiring substrate WS without using the wire BW, it is not necessary to take the wire sweep into consideration. Therefore, it becomes possible to raise the supply pressure of the resin. In this case, by raising the viscosity of the resin, the resin becomes less likely to leak.

<Modification 5>

Figure 27:
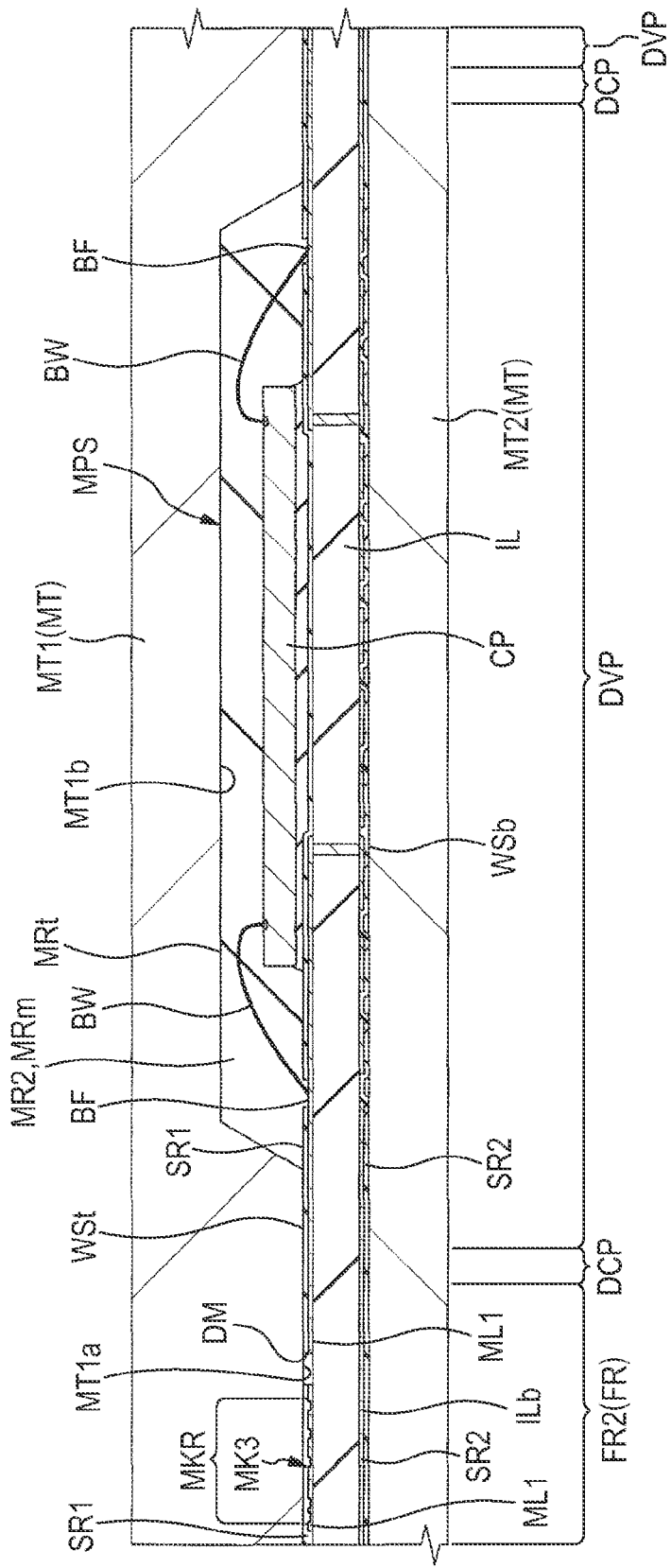
FIG. 27 is an enlarged cross-sectional view showing a modification of the embodiment shown in FIG. 13.

Also, for instance, in the above embodiment, as the method of forming the sealing body MR, the MAP method was described by way of example where there was formed the sealing body MR for collectively covering the device regions DVP. However, as a modification, there may be employed a piece molding method where a cavity is arranged in each of the device regions DVP and a sealing body is formed individually for each device region DVP. FIG. 27 is an enlarged cross-sectional view showing a modification with respect to the embodiment shown in FIG. 13.

When the piece molding method is adopted, as in the modification shown in FIG. 27, the cavity MT1b does not overlap with the dicing region DCP and is arranged inside the device region DVP. Therefore, the main body MRm of the sealing body MR2 formed by the piece molding method does not overlap with the dicing region DCP and is formed inside the device region DVP.

That is, in the case of the piece molding method, as compared with the example of the MAP method shown in FIG. 13, a distance between the main body MRm of the sealing body MR2 and the marking region MKR becomes longer. For this reason, in the case of the piece molding method, the flash resin part MRf (see FIG. 16) is less likely to reach the marking region MKR than the case of the MAP molding method.

<Modification 6>

Also, for instance, in the above embodiment, in each of the manufacturing steps shown in FIG. 4, the explanation was made as to the mode where the mark MK3 was read before or after the processing. However, it is not limited to the mode where the mark MK3 is read before and after all the processing. For instance, the step of reading the mark MK3 can be skipped in a manufacturing step which is determined to be less important for management of the historical data of production. Further, in terms of registering the substrate ID and performing the processing, the mark MK3 may be read either before or after the processing.

Also, as in the method explained with reference to FIG. 10 in the die bonding step, in the ball mounting step and the division-into-pieces step described in the above embodiment, there may be included a step where the code MK3 affixed to the wiring substrate MPS is read and the thus read information (substrate ID) is stored in the main server MS having a memory.

However, since the code MK3 shown in FIG. 16 is formed astride the dicing region DCP, the code MK3 cannot be read after the division-into-pieces step. In such a case, it is possible to identify the historical data of production by reading the code MK2 affixed to the sealing body MR shown in FIG. 1.

<Modification 7>

Although various kinds of modifications have been described as above, those modifications can be applied by being combined with one another.

Also, part of what are disclosed in the embodiments will be described below.

(1) The method of manufacturing semiconductor devices includes the steps of: (a) providing abase material having a first surface, a plurality of device regions formed in the first surface, a frame region provided in the first surface and outside the device regions, and a marking region provided in the frame region, in which the first surface has a first side and a second side opposed to the first side; and the frame region has a first region located between the device regions and the first side and a second region other than the first region, (b) after the step (a), affixing first identification information to the marking region provided in the second region and storing the first identification information in a server, (c) after the step (b), mounting a plurality semiconductor chips in the device regions, respectively, (d) after the step (c), sealing the semiconductor chip with resin and forming a sealing body by clamping the base material using a first metal mold and a second metal mold such that the semiconductor chips are located in a cavity provided in the first metal mold and supplying the resin into the cavity from the side of the first side of the base material, (e) after the step (d), reading the first identification information, and (f) after the step (d), newly affixing second identification information to the sealing body, in which, before the step (d), a dam part is formed between the marking region and the device regions of the frame region.

What is claimed is:

1. A method of manufacturing semiconductor devices, comprising the steps of:
   (a) providing a base material having a first surface, a plurality of device regions formed in the first surface, a plurality of semiconductor chips mounted in the plurality of device regions, respectively, a frame region provided in the first surface and outside the plurality of device regions, a marking region provided in part of the frame region, and first identification information affixed to the marking region,
   wherein the first surface has a first side and a second side opposed to the first side;
   wherein the frame region has a first region located between the device regions and the first side and a second region other than the first region; and
   wherein the marking region is provided in the second region;
   (b) after the step (a), sealing the plurality of semiconductor chips with resin and forming a sealing body by clamping the base material using a first metal mold and a second metal mold such that the plurality of semiconductor chips are located inside a cavity provided in the first metal mold and supplying resin into the cavity from the side of the first side of the base material;
   (c) after the step (b), reading the first identification information; and
   (d) after the step (b), newly affixing a second identification information to the sealing body,
   wherein, before the step (b), a dam part of the frame region is formed between the marking region and the plurality of device regions.

2. The method of manufacturing semiconductor devices according to claim 1,
   wherein the first metal mold has a gate part in communication with the cavity and a vent part arranged on the opposite side of the gate part through the cavity and in communication with the cavity;
   wherein, in the step (b), the resin is supplied from the gate part arranged on the side of the first side of the base material and a gas inside the cavity is discharged from the vent part arranged on the side of the second side of the base material; and wherein the second region of the frame region is located between the second side and the plurality of device regions.

3. The method of manufacturing semiconductor devices according to claim 1, wherein the base material is a wiring substrate having an insulating layer, a plurality of wires formed in the insulating layer, and a plurality of terminals formed in the insulating layer.

4. The method of manufacturing semiconductor devices according to claim 1, wherein the base material is a wiring substrate having a first insulating film formed on the first surface side;

wherein there are formed, on the side of the first side of the base material, a plurality of gate patterns which are metal patterns exposed from the first insulating film and are arranged at a position overlapping a supply port of the resin in the step (b);

wherein, on the side of the second side of the base material, there are formed a plurality of vent patterns which are trench patterns formed in the first insulating film, arranged at a position overlapping an outlet of a gas inside the cavity in the step (b); and wherein, in an extending direction of the first side and the second side of the base material, a width of each of the plurality of gate patterns is greater than a width of each of the plurality of vent patterns.

5. The method of manufacturing semiconductor devices according to claim 4, wherein the second region of the frame region is located between the second side and the plurality of device regions.

6. The method of manufacturing semiconductor devices according to claim 5, wherein the vent patterns are formed in the second region; and wherein, the marking region is formed between adjacent vent patterns of the plurality of vent patterns.

7. The method of manufacturing semiconductor devices according to claim 1, wherein each semiconductor chip is electrically coupled with a respective plurality of terminals formed in the base material via a respective plurality of wires, and wherein, in the step (b), the sealing body is formed by sealing the semiconductor chips and the wires in the cavity with the resin.

8. The method of manufacturing semiconductor devices according to claim 1, wherein the dam part is a trench pattern formed in the first surface of the base material.

9. The method of manufacturing semiconductor devices according to claim 1, wherein the base material is a wiring substrate having an insulating layer, a plurality of wirings formed in the insulating layer, a plurality of terminals formed in the insulating layer, and a first insulating film covering the wirings on the side of the first surface, and wherein the dam part is a trench pattern formed by removing the first insulating film.

10. The method of manufacturing semiconductor devices according to claim 1, wherein the first surface of the base material is quadrangular;

wherein the dam part has a first portion extending along a first direction in which a side where the marking region is formed extends, a second portion extending along a second direction orthogonal to the first direction, and a third portion opposed to the second portion and extending along the second direction, and wherein one end of each of the second and third portions is connected to the first portion and the other end extends to the side where the marking region is formed.

11. The method of manufacturing semiconductor devices according to claim 10, wherein each of the first, second, and third portions extends in a rectilinear manner.

12. The method of manufacturing semiconductor devices according to claim 10, wherein one or both of the second and third portions extend (s) toward the second direction in a meandering manner.

13. The method of manufacturing semiconductor devices according to claim 1, wherein, in the step (b), in a state where the base material is arranged between the first metal mold and the second metal mold such that the device regions are positioned inside the cavity, the sealing body is formed by collectively sealing the device regions.

* * * * *